(12) United States Patent
Yamazaki

(10) Patent No.: US 9,812,585 B2
(45) Date of Patent: Nov. 7, 2017

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/505,002

(22) Filed: Oct. 2, 2014

(65) Prior Publication Data

US 2015/0097181 A1    Apr. 9, 2015

(30) Foreign Application Priority Data

Oct. 4, 2013    (JP) ................. 2013-208764

(51) Int. Cl.
*H01L 29/786*    (2006.01)
*H01L 29/04*    (2006.01)

(52) U.S. Cl.
CPC ...... *H01L 29/78696* (2013.01); *H01L 29/045* (2013.01); *H01L 29/7869* (2013.01); *H01L 29/78648* (2013.01)

(58) Field of Classification Search
CPC .............................................. H01L 29/78696
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Eugene Lee
(74) *Attorney, Agent, or Firm* — Robinson Intellectual Property Law Office; Eric J. Robinson

(57) ABSTRACT

In a semiconductor device including an oxide semiconductor film, defects in the oxide semiconductor film are reduced. In addition, the electrical characteristics of a semiconductor device including an oxide semiconductor film are improved. Furthermore, the reliability of a semiconductor device including an oxide semiconductor film is improved. A semiconductor device including an oxide semiconductor layer and a pair of electrodes in contact with the oxide semiconductor layer and containing copper, aluminum, gold, or silver is provided. The oxide semiconductor layer has a stacked-layer structure including a first oxide semiconductor layer, a second oxide semiconductor layer, and a third oxide semiconductor layer between the first oxide semiconductor layer and the second oxide semiconductor layer; the second oxide semiconductor layer includes a plurality of crystal parts having c-axis alignment; and c-axes of the plurality of crystal parts are aligned in a direction parallel to a normal vector of a top surface of the second oxide semiconductor layer.

15 Claims, 26 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1* | 4/2004 | Kawasaki | H01L 27/15 257/102 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,652,740 B2 | 1/2010 | Hwang et al. | |
| 7,674,650 B2 | 3/2010 | Akimoto et al. | |
| 7,732,819 B2 | 6/2010 | Akimoto et al. | |
| 7,923,722 B2* | 4/2011 | Ryu | H01L 21/02554 257/43 |
| 7,994,500 B2* | 8/2011 | Kim | H01L 29/78606 257/258 |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,274,078 B2 | 9/2012 | Itagaki et al. | |
| 8,344,374 B2 | 1/2013 | Yamazaki et al. | |
| 8,530,285 B2 | 9/2013 | Yamazaki et al. | |
| 8,723,176 B2 | 5/2014 | Yamazaki | |
| 8,748,215 B2 | 6/2014 | Yamazaki | |
| 8,816,349 B2 | 8/2014 | Yamazaki et al. | |
| 9,209,256 B2 | 12/2015 | Tokunaga et al. | |
| 9,293,602 B2* | 3/2016 | Yamazaki | H01L 29/78693 |
| 9,324,810 B2 | 4/2016 | Tokunaga et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1* | 2/2008 | Takechi | H01L 29/4908 438/151 |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0062436 A1 | 3/2011 | Yamazaki et al. | |
| 2011/0193083 A1 | 8/2011 | Kim et al. | |
| 2011/0215328 A1 | 9/2011 | Morosawa et al. | |
| 2011/0240990 A1* | 10/2011 | Yamazaki | H01L 29/7869 257/43 |
| 2012/0119205 A1* | 5/2012 | Taniguchi | H01L 29/78693 257/43 |
| 2012/0132905 A1* | 5/2012 | Yamazaki | H01L 29/4908 257/43 |
| 2014/0021466 A1 | 1/2014 | Yamazaki et al. | |
| 2014/0027762 A1 | 1/2014 | Tsurume et al. | |
| 2014/0203826 A1* | 7/2014 | Evans | H01L 29/24 324/693 |
| 2014/0273341 A1* | 9/2014 | Van Duren | H01L 29/7869 438/104 |
| 2015/0115262 A1 | 4/2015 | Tokunaga et al. | |
| 2016/0197200 A1 | 7/2016 | Tokunaga et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | | |
|---|---|---|---|
| JP | 2003-086808 A | 3/2003 | |
| JP | 2004-103957 A | 4/2004 | |
| JP | 2004-133422 A | 4/2004 | |
| JP | 2004-273614 A | 9/2004 | |
| JP | 2004-273732 A | 9/2004 | |
| JP | 2007-096055 A | 4/2007 | |
| JP | 2009-231613 A | 10/2009 | |
| JP | 2010-016347 A | 1/2010 | |
| JP | 4415062 | 2/2010 | |
| JP | 2010-067954 A | 3/2010 | |
| JP | 2010-177431 A | 8/2010 | |
| JP | 4571221 | 10/2010 | |
| JP | 2012-160679 A | 8/2012 | |
| WO | WO-2004/114391 | 12/2004 | |
| WO | WO-2008/133345 | 11/2008 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGAO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, Vol, 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs",IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

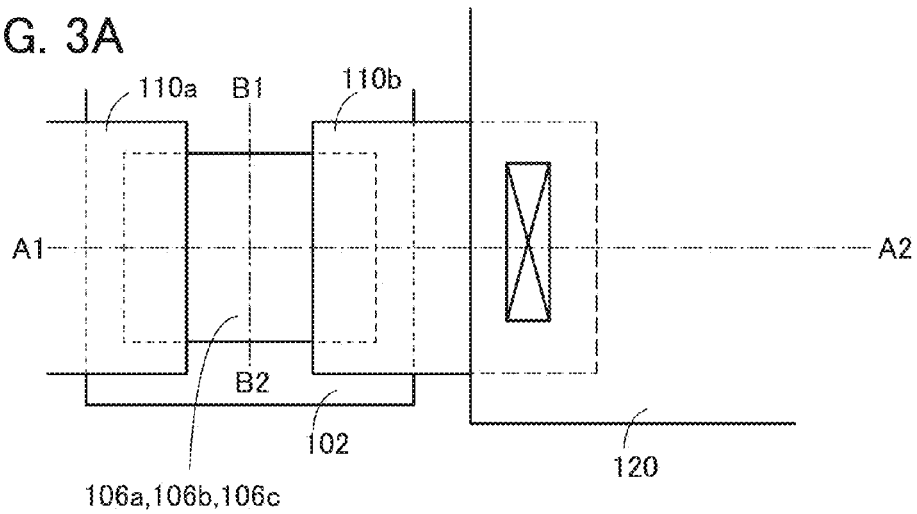
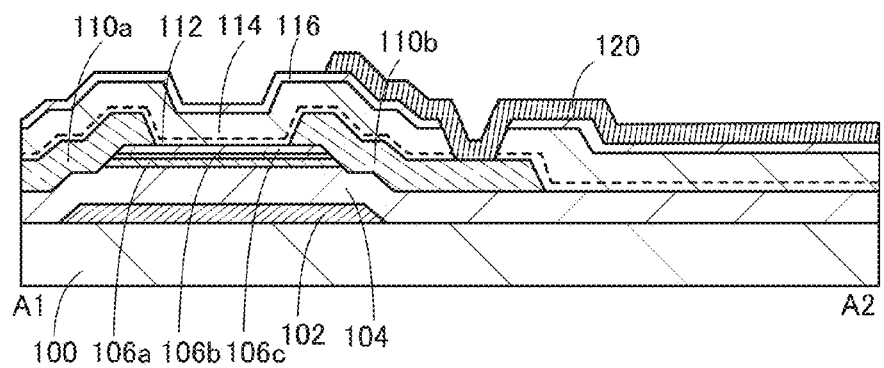
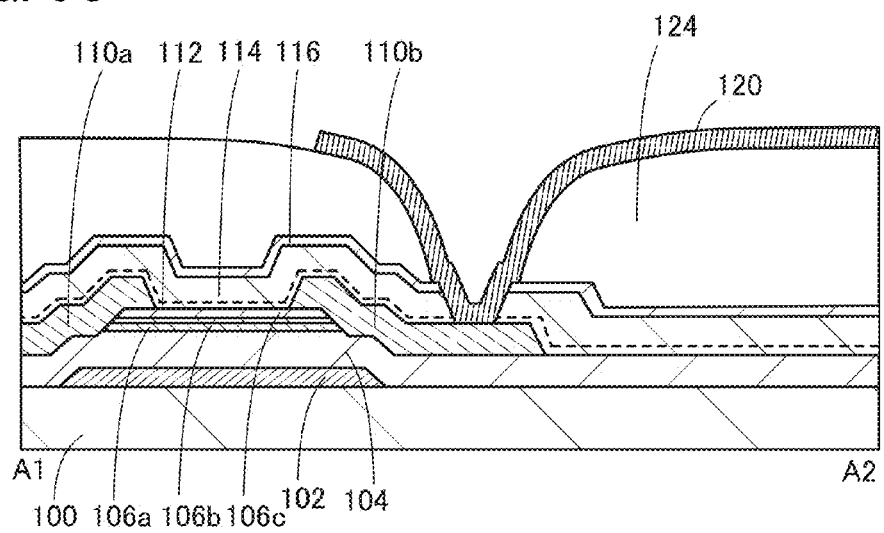

FIG. 17A
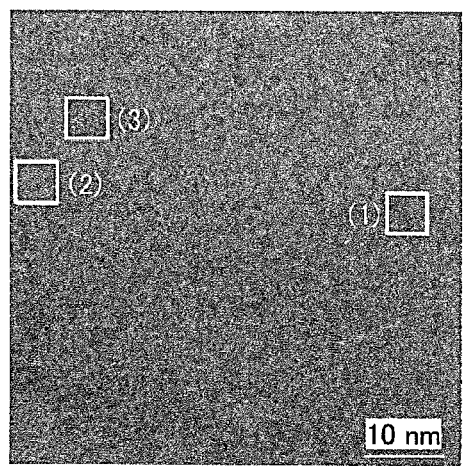
FIG. 17B         FIG. 17C         FIG. 17D
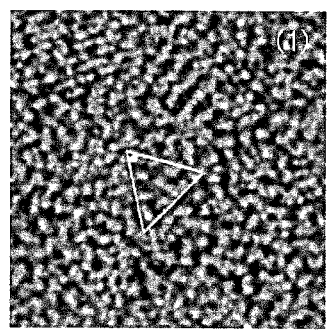   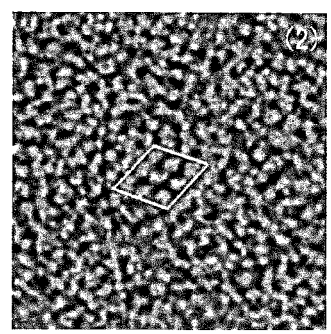   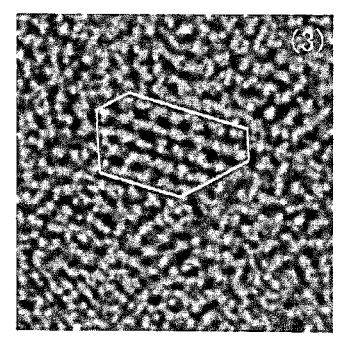

cross section plan view

SEMICONDUCTOR DEVICE

BACKGROUND OF THE INVENTION

1. Field of the Invention

The present invention relates to an object, a method, or a manufacturing method. Further, the present invention relates to a process, a machine, manufacture, or a composition of matter. In particular, one embodiment of the present invention relates to a semiconductor device, a display device, a light-emitting device, a memory device, a method for driving any of them, or a method for manufacturing any of them.

In this specification and the like, a semiconductor device generally means a device that can function by utilizing semiconductor characteristics. An electro-optical device, an image display device (also simply referred to as a display device), a semiconductor circuit, a light-emitting device, a power storage device, a memory device, and an electronic appliance may include a semiconductor device.

2. Description of the Related Art

As semiconductor materials of transistors used for most display devices typified liquid crystal display devices and light-emitting display devices and most integrated circuits (ICs), silicon semiconductors such as amorphous silicon, single crystal silicon, and polycrystalline silicon are known. Furthermore, as other semiconductor materials, oxide semiconductors have been attracting attention. For example, a technique for applying a transistor in which zinc oxide or In—Ga—Zn-based oxide is used as an oxide semiconductor for a channel, to a display device, is disclosed (Patent Document 1).

In addition, to reduce wiring delay due to increase in wiring resistance and parasitic capacitance caused by increase in size and definition of a display device, a technique to form a wiring using a low-resistance material such as copper, aluminum, gold, or silver is considered (Patent Document 2).

REFERENCE

Patent Documents

[Patent Document 1] Japanese Published Patent Application No. 2007-096055
[Patent Document 2] Japanese Published Patent Application No. 2004-133422

SUMMARY OF THE INVENTION

In a transistor including an oxide semiconductor, a large amount of impurities (typically, silicon, which is a constituent element of an insulating layer; carbon; and copper, which is a constituent material of a wiring) contained in an oxide semiconductor layer causes a reduction in electrical characteristics (e.g., on-state current characteristics) of the transistor.

Thus, an object of one embodiment of the present invention is to reduce the concentration of impurities contained in an oxide semiconductor layer of a semiconductor device such as a transistor including an oxide semiconductor. Another object of one embodiment of the present invention is to improve electrical characteristics of a semiconductor device or the like including an oxide semiconductor. Another object of one embodiment of the present invention is to improve reliability of a semiconductor device or the like including an oxide semiconductor. Another object of one embodiment of the present invention is to provide a novel semiconductor device or the like.

Note that the description of these objects does not disturb the description of other objects. One embodiment of the present invention does not necessarily achieve all the objects. Objects other than the above objects will be apparent from and can be derived from the description of the specification and the like.

One embodiment of the present invention is a semiconductor device including an oxide semiconductor layer; and a pair of electrodes in contact with the oxide semiconductor layer and containing copper, aluminum, gold, or silver. The oxide semiconductor layer has a stacked-layer structure including a first oxide semiconductor layer, a second oxide semiconductor layer, and a third oxide semiconductor layer between the first oxide semiconductor layer and the second oxide semiconductor layer; the second oxide semiconductor layer includes a plurality of crystal parts having c-axis alignment; and c-axes of the plurality of crystal parts are aligned in a direction parallel to a normal vector of a top surface of the second oxide semiconductor layer.

In the above structure, it is preferable that the first oxide semiconductor layer include a plurality of crystal parts having c-axis alignment, and that c-axes of the plurality of crystal parts be aligned in a direction parallel to a normal vector of a top surface of the first oxide semiconductor layer.

Another embodiment of the present invention is a semiconductor device including an oxide semiconductor layer; and a pair of electrodes in contact with the oxide semiconductor layer and containing copper, aluminum, gold, or silver. The oxide semiconductor layer has a stacked-layer structure including a first oxide semiconductor layer, a second oxide semiconductor layer, and a third oxide semiconductor layer between the first oxide semiconductor layer and the second oxide semiconductor layer; the electron affinity of the second oxide semiconductor layer is smaller than the electron affinity of the first oxide semiconductor layer; the second oxide semiconductor layer includes a plurality of crystal parts having c-axis alignment; and c-axes of the plurality of crystal parts are aligned in a direction parallel to a normal vector of a top surface of the second oxide semiconductor layer.

Another embodiment of the present invention is a semiconductor device including a first gate electrode; a gate insulating layer in contact with the first gate electrode; an oxide semiconductor layer facing the first gate electrode with the gate insulating layer positioned therebetween; and a pair of electrodes in contact with the oxide semiconductor layer and containing copper, aluminum, gold, or silver. The oxide semiconductor layer has a stacked-layer structure including a first oxide semiconductor layer, a second oxide semiconductor layer, and a third oxide semiconductor layer between the first oxide semiconductor layer and the second oxide semiconductor layer; the electron affinity of the second oxide semiconductor layer is smaller than the electron affinity of the first oxide semiconductor layer; the second oxide semiconductor layer includes a plurality of crystal parts having c-axis alignment; and c-axes of the plurality of crystal parts are aligned in a direction parallel to a normal vector of a top surface of the second oxide semiconductor layer.

Another embodiment of the present invention is a semiconductor device including a first gate electrode; a first gate insulating layer in contact with the first gate electrode, an oxide semiconductor layer facing the first gate electrode with the first gate insulating layer positioned therebetween; a pair of electrodes in contact with the oxide semiconductor layer and containing copper, aluminum, gold, or silver; a second gate insulating layer over and in contact with the pair of electrodes; and a second gate electrode facing the oxide semiconductor layer with the second gate insulating layer positioned therebetween. The oxide semiconductor layer has a stacked-layer structure including a first oxide semiconductor layer, a second oxide semiconductor layer, and a third oxide semiconductor layer between the first oxide semiconductor layer and the second oxide semiconductor layer; the electron affinity of the second oxide semiconductor layer is smaller than electron the affinity of the first oxide semiconductor layer; the second oxide semiconductor layer includes a plurality of crystal parts having c-axis alignment; and c-axes of the plurality of crystal parts are aligned in a direction parallel to a normal vector of a top surface of the second oxide semiconductor layer.

In any of the above structures, a channel is formed in the first oxide semiconductor layer.

In any of the above structures, it is preferable that the first oxide semiconductor layer include a plurality of crystal parts having c-axis alignment, and that c-axes of the plurality of crystal parts be aligned in a direction parallel to a normal vector of a top surface of the first oxide semiconductor layer.

In any of the above structures, the electron affinity of the second oxide semiconductor layer is larger than the electron affinity of the third oxide semiconductor layer.

In any of the above structures, it is preferable that the second oxide semiconductor layer and the third oxide semiconductor layer contain one or more kinds of metal elements contained in the first oxide semiconductor layer.

In any of the above structures, the second oxide semiconductor layer includes a region; with a transmission electron diffraction measurement apparatus, a diffraction pattern having a bright spot indicating alignment is observed in greater than or equal to 50% and less than 100% of the region when an observation area is changed one-dimensionally within a range of 300 nm.

In any of the above structures, the first oxide semiconductor layer includes a region; with a transmission electron diffraction measurement apparatus, a diffraction pattern having a bright spot indicating alignment is observed in greater than or equal to 50% and less than 100% of the region when an observation area is changed one-dimensionally within a range of 300 nm.

According to an embodiment of the disclosed invention, the concentration of impurities contained in the oxide semiconductor layer can be reduced. According to one embodiment of the present invention, the electrical characteristics of the semiconductor device or the like including an oxide semiconductor can be improved. According to one embodiment of the present invention, the reliability of the semiconductor device or the like including an oxide semiconductor can be improved. According to one embodiment of the present invention, a novel semiconductor device or the like can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 3A to 3C are a plan view and cross-sectional views of a transistor of one embodiment of the present invention.

FIGS. 17A to 17D are Cs-corrected high-resolution TEM images of a plane of a CAAC-OS.

DETAILED DESCRIPTION OF THE INVENTION

Figure 1A:
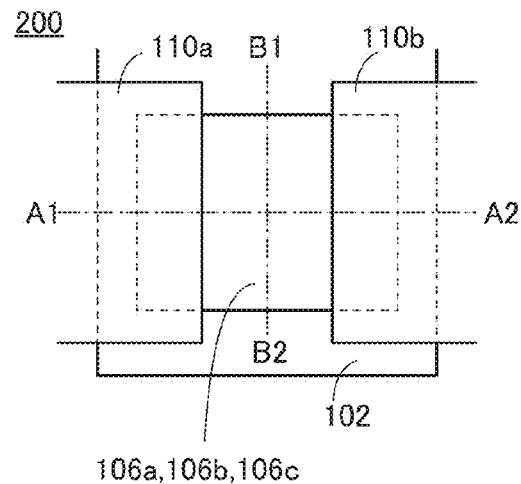
FIGS. 1A to 1C are a plan view, a cross-sectional view, and a band diagram of a transistor of one embodiment of the present invention.

Embodiments of the present invention will be described below in detail with reference to the drawings. Note that the present invention is not limited to the description below, and it is easily understood by those skilled in the art that a variety of changes and modifications can be made without departing from the spirit and scope of the present invention. Therefore, the present invention should not be interpreted as being limited to the description of Embodiments below. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In this specification and the like, ordinal numbers such as "first", "second", and the like are used in order to avoid confusion among components, and the terms do not limit the components numerically. Therefore, for example, description can be made even when "first" is replaced with "second" or "third", as appropriate.

Functions of a "source" and a "drain" are sometimes interchanged with each other as appropriate when the direction of current flow is changed in circuit operation, for example. Thus, in this specification and the like, the terms "source" and "drain" can be replaced with each other.

In this specification and the like, the term such as "over" or "below" does not necessarily mean that a component is placed "directly over" or "directly below" another component. For example, the expression "a gate electrode over a gate insulating layer" does not exclude the case where a component is placed between the gate insulating layer and the gate electrode. The same applies to the term "below".

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a semiconductor device which is one embodiment of the present invention and a manufacturing method thereof are described with reference to FIGS. 1A to 1C, FIGS. 2A to 2C, FIGS. 3A to 3C, FIGS. 4A and 4B, FIGS. 5A to 5C, FIG. 6, FIGS. 7A and 7B, FIGS. 8A and 8B, FIGS. 9A and 9B, FIGS. 10A and 10B, FIGS. 11A and 11B, FIG. 12, FIGS. 13A and 13B, FIGS. 14A to 14I, and FIGS. 15A to 15C.

<Structure Example 1 of Transistor>

Figure 1B:
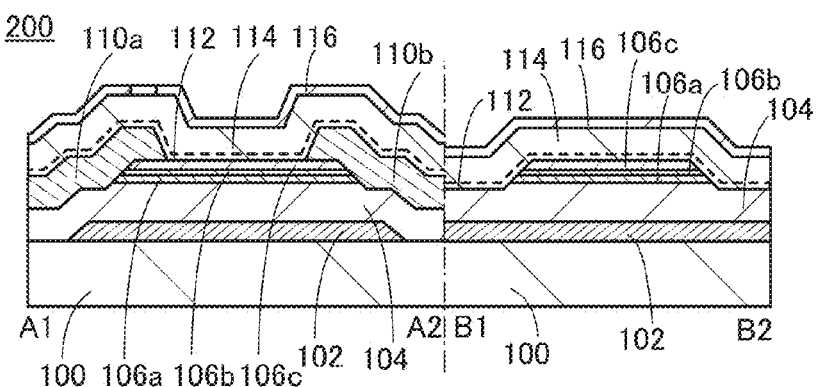
Figure 1C:
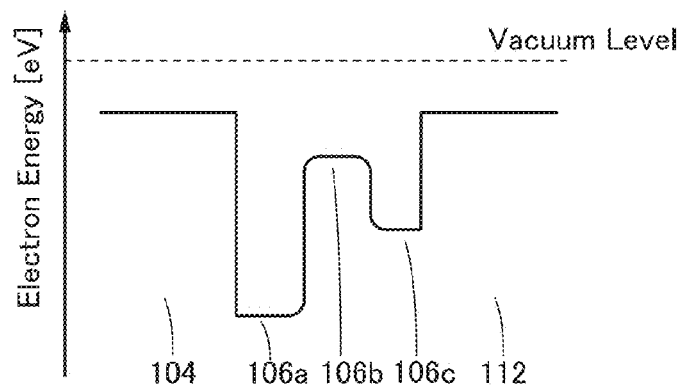

FIGS. 1A and 1B are a plan view and a cross-sectional view of a transistor 200 included in a semiconductor device of this embodiment. The transistor 200 illustrated in FIGS. 1A and 1B is a channel-etched transistor. FIG. 1A is a plan view of the transistor 200, and FIG. 1B is a cross-sectional view taken along dashed dotted lines A1-A2 and B1-B2 in FIG. 1A. Note that a substrate 100 and some components (e.g., a gate insulating layer) of the transistor 200 are not illustrated in FIG. 1A for simplicity. FIG. 1C shows a band diagram of a stacked-layer structure included in the transistor 200.

The transistor 200 illustrated in FIGS. 1A and 1B includes a gate electrode 102 formed over a substrate 100, a gate insulating layer 104 in contact with the gate electrode 102, an oxide semiconductor layer 106a facing the gate electrode 102 with the gate insulating layer 104 positioned therebetween, an oxide semiconductor layer 106b over the oxide semiconductor layer 106a, an oxide semiconductor layer 106c over the oxide semiconductor layer 106b, and a pair of electrodes (electrodes 110a and 110b) in contact with the oxide semiconductor layer 106c. Furthermore, the transistor 200 may include an oxide insulating layer 112, an oxide insulating layer 114, and a nitride insulating layer 116 which are formed over the pair of electrodes (the electrodes 110a and 110b) and the oxide semiconductor layer 106c.

In the transistor 200, the oxide semiconductor layer 106c in contact with the oxide semiconductor layer 106b functions as a barrier layer for preventing a constituent element of the pair of electrodes (the electrodes 110a and 110b) from diffusing to the oxide semiconductor layer 106a. The oxide semiconductor layer 106c is a CAAC-OS (c-axis aligned crystalline oxide semiconductor) layer described later. In the CAAC-OS layer, which has c-axis alignment, a grain boundary is not found and the c-axes are aligned in a direction parallel to a normal vector of a formation surface (a surface where the CAAC-OS is formed) or a normal vector of a top surface. That is, since atoms of the CAAC-OS layer are arranged orderly, the CAAC-OS layer has high density and thus can block diffusion of the constituent element of the pair of electrodes (the electrodes 110a and 110b).

The oxide semiconductor layer 106c can also prevent constituent elements of the oxide insulating layer 112 or the like provided over the oxide semiconductor layer 106a from mixing into the oxide semiconductor layer 106a. The prevention of mixing of impurities into the oxide semiconductor layer 106a where the channel is formed can inhibit a reduction in the electrical characteristics of the transistor 200.

FIG. 1C is an example of a band structure in the thickness direction of the stacked-layer structure including the gate insulating layer 104, the oxide semiconductor layer 106a, the oxide semiconductor layer 106b, the oxide semiconductor layer 106c, and the oxide insulating layer 112. For easy understanding, the energy of the bottom of the conduction band (Ec) of each of the gate insulating layer 104, the oxide semiconductor layer 106a, the oxide semiconductor layer 106b, the oxide semiconductor layer 106c, and the oxide insulating layer 112 is shown in the band structure.

As illustrated in FIG. 1C, the energy of the bottom of the conduction band is changed smoothly (such a state is also referred to as a continuous junction) between the oxide semiconductor layer 106a, the oxide semiconductor layer 106b, and the oxide semiconductor layer 106c. In other words, the energy of the bottom of the conduction band is continuously changed. In order to obtain such a band structure, there exists no impurity that forms a defect state such as a trap center or a recombination center at the interface between the oxide semiconductor layer 106a and the oxide semiconductor layer 106b and between the oxide semiconductor layer 106b and the oxide semiconductor layer 106c.

In order to form such a continuous energy band between the oxide semiconductor layer 106a, the oxide semiconductor layer 106b, and the oxide semiconductor layer 106c, it is necessary to form films continuously without being exposed to air, with use of a multi-chamber deposition apparatus (sputtering apparatus) including a load lock chamber.

With the structure of FIG. 1C, the oxide semiconductor layer 106a serves as a well, and a channel region is formed in the oxide semiconductor layer 106a in the transistor with the stacked-layer structure.

As described in Embodiment 2, although trap states due to impurities or defects might be formed in the vicinity of the interface between the oxide semiconductor layer 106c and the oxide insulating layer 112, the oxide semiconductor layers 106a and 106b can be apart from the trap states owing to the existence of the oxide semiconductor layer 106c.

Application of voltage to the transistor 200 changes the energy of the bottom of the conduction band (Ec) in each component. By the change, the trap states might be more distant from the vacuum level than the energy of the bottom of the conduction band (Ec) of the oxide semiconductor layer 106a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy of the bottom of the conduction band (Ec) of the oxide semiconductor layer 106a even in the state where voltage is applied to the transistor 200. Such a structure inhibits accumulation of electrons in the trap states. As a result, the on-state current and the field-effect mobility of the transistor can be increased.

The oxide semiconductor layer 106a and the oxide semiconductor layer 106b in the transistor 200 are each formed using a metal oxide containing at least In or Zn; as a typical example, an In—Ga oxide, an In—Zn oxide, or an In-M-Zn oxide (M is Ti, Ga, Y, Zr, La, Ce, Nd, or HO can be used. The enemy of the bottom of the conduction band of the oxide semiconductor layer 106b) is closer to the vacuum level than that of the oxide semiconductor layer 106a; typically, an energy difference between the bottom of the conduction band of the oxide semiconductor layer 106b and the bottom of the conduction band of the oxide semiconductor layer 106a is greater than or equal to 0.15 eV or greater than or equal to 0.5 eV, and less than or equal to 2 eV or less than or equal to 1 eV. That is, the difference in electron affinity between the oxide semiconductor layer 106b and the oxide semiconductor layer 106a is greater than or equal to 0.15 eV or greater than or equal to 0.5 eV, and less than or equal to 2 eV or less than or equal to 1 eV.

In such a structure, the oxide semiconductor layer 106a serves as a main path of current and functions as a channel region when voltage is applied to the transistor 200. In addition, since the oxide semiconductor layer 106b contains one or more kinds of metal elements that are contained in the oxide semiconductor layer 106a where the channel is formed, interface scattering is less likely to occur at the interface between the oxide semiconductor layer 106a and the oxide semiconductor layer 106b. Thus, the transistor can have high field-effect mobility because the movement of carriers is not hindered at the interface.

To prevent the oxide semiconductor layer 106c from functioning as part of a channel formation region, a material having sufficiently low conductivity is used. Alternatively, for the oxide semiconductor layer 106c, a material which has smaller electron affinity (energy difference between the vacuum level and the bottom of the conduction band) than the oxide semiconductor layer 106a and has a difference in energy of the bottom of the conduction band from the oxide semiconductor layer 106a (i.e., has a band offset) is used. To prevent generation of a difference in threshold voltage (hysteresis) depending on the level of a drain voltage, the material of the oxide semiconductor layer 106c is preferably selected so that the energy of the bottom of the conduction band of the oxide semiconductor layer 106c is closer to the vacuum level than the energy of the bottom of the conduction band of the oxide semiconductor layer 106a by 0.2 eV or more, preferably 0.5 eV or more.

When the oxide semiconductor layer 106c that is a CAAC-OS layer is in contact with the oxide semiconductor layer 106a where the channel is formed, a band offset between the oxide semiconductor layer 106a and the oxide semiconductor layer 106c becomes smaller, and carriers are trapped at the interface between the oxide semiconductor layer 106a and the oxide semiconductor layer 106c to move to the oxide semiconductor layer 106a.

Therefore, it is preferable that the oxide semiconductor layer 106b be provided between the oxide semiconductor layer 106a and the oxide semiconductor layer 106c so that a band offset is formed between the oxide semiconductor layer 106a and the oxide semiconductor layer 106b.

It is preferable that the oxide semiconductor layer 106c not have a spinel crystal structure. This is because in the case where the oxide semiconductor layer 106c has a spinel crystal structure, the constituent element of the pair of electrodes (the electrodes 110a and 110b, might diffuse to the oxide semiconductor layer 106a through the oxide semiconductor layer 106b owing to the spinel crystal structure.

The thickness of the oxide semiconductor layer 106c is greater than or equal to a thickness that is capable of inhibiting diffusion of the constituent element of the pair of electrodes (the electrodes 110a and 110b) into the oxide semiconductor layer 106a through the oxide semiconductor layer 106b, and less than a thickness which inhibits supply of oxygen from the oxide insulating layer 112 to the oxide semiconductor layer 106a. For example, when the thickness of the oxide semiconductor layer 106a is greater than or equal to 10 nm, the constituent element of the pair of electrodes (the electrodes 110a and 110b) can be prevented from diffusing into the oxide semiconductor layer 106a. When the thickness of the oxide semiconductor layer 106c is less than or equal to 100 nm, oxygen can be effectively supplied from the oxide insulating layers 112 and 114 to the oxide semiconductor layer 106a.

In the transistor 200, side surfaces of the oxide semiconductor layer 106a where the channel is formed are in contact with the pair of electrodes (the electrodes 110a and 110b) functioning as a source electrode and a drain electrode, and in the contact regions, a source region and a drain region are formed. Therefore, the oxide semiconductor layer 106c may have an insulating property.

Note that as illustrated in FIG. 1C, it is preferable that the energy of the bottom of the conduction band of the oxide semiconductor layer 106b be closer to the vacuum level than the energy of the bottom of the conduction band of the oxide semiconductor layer 106c.

When the oxide semiconductor layer 106b is an In-M-Zn oxide in which the atomic ratio of the element M (M is Ti, Ga, Y. Zr, La, Ce, Nd, or Hf) is higher than that of In, the energy gap of the oxide semiconductor layer 106b can be large and the electron affinity can be small. Therefore, a difference in electron affinity between the oxide semiconductor layer 106a and the oxide semiconductor layer 106b may be controlled by the proportion of the element M. Furthermore, oxygen vacancy is less likely to be generated in the oxide semiconductor layer in which the atomic ratio of Ti, Ga, Y, Zr, La, Ce, Nd, or Hf is higher than that of In because Ti, Ga, Y, Zr, La, Ce, Nd, and Hf each are a metal element that is strongly bonded to oxygen.

For example, in the case where the oxide semiconductor layer 106b is an In-M-Zn oxide, when Zn and O are eliminated from consideration, the proportion of In and the proportion of M are preferably less than 50 atomic % and greater than or equal to 50 atomic %, respectively, further preferably less than 25 atomic % and greater than or equal to 75 atomic %, respectively.

In the case where each of the oxide semiconductor layer 106a and the oxide semiconductor layer 106b is In-M-Zn oxide film (M is Ti, Ga, Y, Zr, La, Ce, Nd, or Hf), the proportion of M (M is Ti, Ga, Y, Zr, La, Ce, Nd, or Hf) in the oxide semiconductor layer 106b is higher than that in the oxide semiconductor layer 106b. Typically, the proportion of M in the oxide semiconductor layer 106b is 1.5 or more times, preferably twice or more, and more preferably three or more times as high as that in the oxide semiconductor layer 106b.

In the case where the oxide semiconductor layer 106a is an I-M-Zn oxide (M is Ti, Ga, Y, Zr, La, Ce, Nd, or Hf) with an atomic ratio of In:M:Zn=$x_1$:$y_1$:$z_1$ and the oxide semiconductor layer 106b is an In-M-Zn oxide with an atomic ratio of In:M:Zn=$x_2$:$y_2$:$z_2$, $y_2/x_2$ is greater than $y_1/x_1$, or preferably $y_2/x_2$ is 1.5 or more times as large as $y_1/x_1$. More preferably, $y_2/x_2$ is twice or more as large as $y_1/x_1$, or still more preferably $y_2/x_2$ is three or more times as large as $y_1/x_1$. In this case, it is preferable that in the oxide semiconductor layer 106a, $y_1$ be higher than or equal to $x_1$ because a transistor including the oxide semiconductor layer can have stable electric characteristics. However, when $y_1$ is higher than or equal to three times $x_1$, the field-effect mobility of the transistor including the oxide semiconductor layer is reduced. Thus, it is preferable that $y_1$ be lower than three times $x_1$.

In the case where the oxide semiconductor layer 106a is an In-M-Zn oxide (M is Ti, Ga, Y, Zr, La, Ce, Nd, or Hf) and a target having an atomic ratio of metal elements of In:M:Zn=$x_1$:$y_1$:$z_1$ is used for depositing the oxide semiconductor layer 106a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS layer to be described later as the oxide semiconductor layer 106a is easily formed. Typical examples of the atomic ratio of the metal elements of the target include In:M:Zn=1:1:1 and In:M:Zn=3:1:2.

Note that in the case where a target with In:M:Zn=1:1:$z_{10}$ is used for depositing the oxide semiconductor layer 106a, $z_{10}$ is preferably greater than or equal to 1 and less than or equal to 1.4, further preferably greater than or equal to 1 and less than or equal to 1.3. This is because, for example, when In:M:Zn is 1:1:1.5, the target becomes opaque, and sputtering deposition with a DC power source or an AC power source might become difficult. Such a target is applicable to deposition using an RE power source; however, in consideration of productivity of the semiconductor device, it is preferable to use a target which is applicable to a sputtering deposition using a DC power source or an AC power source.

In the case where the oxide semiconductor layer 106b is an In-M-Zn oxide (M is Ti, Ga, Y, Zr, La, Ce, Nd, or Hf) and a target having an atomic ratio of metal elements of In:M:Zn=$x_2$:$y_2$:$z_2$ is used for depositing the oxide semiconductor layer 106b, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of the oxide semiconductor layer 106b can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, and In:M:Zn=1:4:5.

For example, in the case where a target with In:M:Zn=1:3:$z_{20}$ is used as the target for depositing the oxide semiconductor layer 106b, $z_{20}$ is preferably greater than or equal to 2 and less than or equal to 5. Alternatively, in the case where a target having an atomic ratio of In:M:Zn=1:4:$z_{30}$ is used for depositing the oxide semiconductor layer 106b, $z_{30}$ is preferably greater than or equal to 2 and less than or equal to 5.

In each of the oxide semiconductor layers 106a and 106b, the proportions vary within a range of ±40% as an error.

It is preferable that the oxide semiconductor layer 106a and the oxide semiconductor layer 106b have crystal parts, further preferably, have the same crystal structures. This is because when the oxide semiconductor layer 106a and the oxide semiconductor layer 106b have different crystal structures, the interface between the layers becomes a hetero crystalline structure part and a defect might be generated therein. The hetero crystalline structure part can be regarded as, for example, a grain boundary.

As the oxide semiconductor layer 106a, a CAAC-OS layer that is an oxide semiconductor layer having a low impurity concentration and low density of defect states (a small amount of oxygen vacancy) is preferably used. The state in which impurity concentration is low and density of defect states is low is referred to as highly purified intrinsic or substantially highly purified intrinsic. A highly purified intrinsic or substantially highly purified intrinsic oxide semiconductor layer has few carrier generation sources, and thus has a low carrier density. Thus, a transistor using the oxide semiconductor layer as a channel rarely has electrical characteristics in which a threshold voltage is negative (also referred to as nortnally-on). A highly purified intrinsic or substantially highly purified intrinsic oxide semiconductor layer has few carrier traps. Thus, the transistor including the oxide semiconductor layer in the channel has a small variation in electrical characteristics and high reliability. In a transistor using the CAAC-OS layer, change in electrical characteristics due to irradiation with visible light or ultraviolet light is small.

Note that it is preferable to use a target with In:M:Zn=1:1:1.2 to deposit the oxide semiconductor layer 106a because a spinel structure is less likely to be formed in the deposited oxide semiconductor layer 106a, so that the proportion of a region where a diffraction pattern of a CAAC-OS layer is observed (also referred to as the proportion of CAAC) can be increased.

The thickness of the oxide semiconductor layer 106a is greater than or equal to 3 nm and less than or equal to 200 nm, preferably greater than or equal to 3 nm and less than or equal to 100 nm, more preferably greater than or equal to 3 nm and less than or equal to 50 nm.

An oxide semiconductor layer with low carrier density is used as the oxide semiconductor layer 106a. For example, an oxide semiconductor layer whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$ is used as the oxide semiconductor layer 106a.

Note that, without limitation to those described above, a material with an appropriate composition may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 106a be set to appropriate values.

Note that it is preferable to use, as the oxide semiconductor layer 106a, an oxide semiconductor layer in which the impurity concentration is low and the density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor can have few carrier generation sources, and thus has a low carrier. Thus, a transistor including the oxide semiconductor layer in which a channel region is formed rarely has a negative threshold voltage (is rarely normally-on). Thus, the transistor including the oxide semiconductor layer in the channel formation region has a small variation in electrical characteristics and high reliability in some cases. Furthermore, the highly purified intrinsic or substantially highly purified intrinsic oxide semiconductor layer has an extremely low off-state current; even when an element has a channel width of $1\times10^6$ μm and a channel length L of 10 μm, the off-state current can be less than or equal to the measurement limit of a semiconductor parameter analyzer, i.e less than or equal to $1\times10^{-13}$ A, at a voltage (drain voltage) between a source electrode and a drain electrode in the range from 1 V to 10 V.

Thus, the transistor in which the channel region is formed in the highly purified or substantially highly purified oxide semiconductor layer can have a small variation in electrical characteristics and high reliability. Charges trapped by the trap states in the oxide semiconductor layer take a long time to be released and may behave like fixed charges. Thus, the transistor in which the channel region is formed in the oxide semiconductor layer having a high density of defect states may have unstable electrical characteristics. As examples of the impurities, hydrogen, nitrogen, alkali metal, alkaline earth metal, and the like are given.

Hydrogen contained in the oxide semiconductor layer reacts with oxygen bonded to a metal atom to be water, and also causes oxygen vacancy in a lattice from which oxygen is released for a portion from which oxygen is released). Due to entry of hydrogen into the oxygen vacancy, an electron serving as a carrier is generated. Furthermore, in some cases, bonding of part of hydrogen to oxygen bonded to a metal element causes generation of an electron serving as a carrier. Thus, a, transistor including an oxide semiconductor which contains hydrogen is likely to be normally on. Accordingly, it is preferable that hydrogen be reduced as much as possible in the oxide semiconductor layer 106a. Specifically, in the oxide semiconductor layer 106a, the concentration of hydrogen which is measured by secondary ion mass spectrometry (SIMS) is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

When silicon or carbon which is one of elements belonging to Group 14 is contained in the oxide semiconductor layer 106a, the amount of oxygen vacancy is increased, and the oxide semiconductor layer 106a is changed to an n-type. Thus, the concentration of silicon or carbon (the concentration is measured by SIMS) in the oxide semiconductor layer 106a or the concentration of silicon or carbon (the concentration is measured by SIMS) in the vicinity of the interface between the oxide semiconductor layer 106a and the oxide semiconductor layer 106b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor layer 106a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Therefore, it is preferable to reduce the concentration of alkali metal or alkaline earth metal of the oxide semiconductor layer 106a.

Furthermore, when nitrogen is contained in the oxide semiconductor layer 106a, electrons serving as carriers are generated to increase the carrier density, so that the oxide semiconductor layer 106a easily becomes n-type. Thus, a transistor including an oxide semiconductor which contains nitrogen is likely to be normally on. For this reason, nitrogen in the oxide semiconductor layer is preferably reduced as much as possible; the concentration of nitrogen which is measured by SIMS is preferably set, to, for example, lower than or equal to $5\times10^{18}$ atoms/cm$^3$.

The oxide semiconductor layer 106a may have a non-single crystal structure, for example. The non-single crystal structure includes a CAAC-OS, a polycrystalline structure, a microcrystalline structure described later, or an amorphous structure, for example. Among the non-single crystal structure, the amorphous structure has the highest density of defect states, whereas CAAC-OS has the lowest density of defect states.

The oxide semiconductor layer 106a may have an amorphous structure, for example. An oxide semiconductor layer which has an amorphous structure has disordered atomic arrangement and no crystalline component, for example. Alternatively, an oxide layer having an amorphous structure has, for example, an absolutely amorphous structure and has no crystal part.

Note that the oxide semiconductor layer 106a may be a mixed film including two or more of the following: a region having an amorphous structure, a region having a microcrystalline structure, a region having a polycrystalline structure, a CAAC-OS region, and a region having a single crystal structure. The mixed film includes, for example, two or more of a region having an amorphous structure, a region having a microcrystalline structure, a region having a polycrystalline structure, a CAAC-OS region, and a region having a single crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases. Note that the oxide semiconductor layer 106b in contact with the oxide semiconductor layer 106a can have an amorphous structure, a microcrystalline structure, a polycrystalline structure, or the like, for example.

In the case where an insulating layer which contains a different constituent element (e.g., silicon) from the oxide semiconductor is provided in contact with the oxide semiconductor layer 106a, an interface state due to heterojunction, entry of impurities, or the like might be formed at the interface between the oxide semiconductor layer 106a and the insulating layer. In the transistor 200 of this embodiment, the oxide semiconductor layer 106b and the oxide semiconductor layer 106c which have the same constituent element as the oxide semiconductor is provided between the oxide semiconductor layer 106a and the oxide insulating layer 112 which may have a different constituent element (e.g., silicon) front the oxide semiconductor. Hence, if trap states are formed between the oxide semiconductor layer 106c and the oxide insulating layer 112 owing to impurities and defects, electrons flowing in the oxide semiconductor layer 106a are less likely to be captured by the trap states because there is a distance between the trap states and the oxide semiconductor layer 106a. Accordingly, the amount of on-state current of the transistor can be increased, and the e field-effect mobility can be increased. When the electrons are captured by the trap states, the electrons become negative fixed charges. As a result, a threshold voltage of the transistor fluctuates. However, by the distance between the oxide semiconductor layer 106a and the trap states, capture of the electrons by the trap states can be reduced, and accordingly a fluctuation of the threshold voltage can be reduced.

In the transistor 200 described in this embodiment, the pair of electrodes (the electrodes 110a and 110b) functioning as source and drain electrodes are preferably formed with a single layer or a stacked layer of a single metal that is a low-resistance material, such as copper, aluminum, gold, or silver; an alloy containing any of these materials, or a compound containing any of these materials as a main component. The pair of electrodes (the electrodes 110a and 110b) also functions as wirings; therefore, even in the case where a large-sized substrate is used as the substrate 100, when the electrodes are formed to contain a low-resistance material such as copper, aluminum, gold, or sifter, a semiconductor device in which wiring delay is suppressed can be manufactured.

In the case where the pair of electrodes (the electrodes 110a and 110b) has a two-layer structure, the pair of electrodes (the electrodes 110a and 110b) is formed so that the second conductive layer has a large thickness and contains a single metal that is a low-resistance material, such as copper, aluminum, gold, or silver, an alloy containing any of these materials, or a compound containing any of these components as a main component; and a conductor functioning as a barrier layer against a conductor of the second conductive layer is used for the first conductive layer that is in contact with the side surfaces of the oxide semiconductor layers 106a and 106b and the side surface and top surface of the oxide semiconductor layer 106c. For example, a conductive layer of titanium, tantalum, molybdenum, tungsten; an alloy containing any of these elements; or a conductive layer containing titanium nitride, tantalum nitride, molybdenum nitride, tungsten nitride; or the like can be used as the barrier layer. In the case where the pair of electrodes (the electrodes 110a and 110b) has a three-layer structure, the third conductive layer is preferably formed using a conductor functioning as a barrier layer against a conductor of the second conductive layer so as to be over and in contact with the first and second conductive layers.

In the case where the pair of electrodes (the electrodes 110a and 110b) has a two-layer structure, for example, any of the following structures is preferably used: a structure in which an aluminum film is stacked on a titanium film; a structure in which a copper film is stacked on a tungsten film; a structure in which an aluminum film is stacked on a tungsten film; a structure in which a copper film is stacked on a copper-magnesium-aluminum alloy film; a structure in which a copper film is stacked on a titanium film; and a structure in which a copper film is stacked on a tungsten film. In the case where the pair of electrodes (the electrodes 110a and 110b) has three-layer structure, a film formed of titanium, titanium nitride, molybdenum, or molybdenum nitride is preferably formed as each of the first and third conductive layers, and a film formed of a low-resistance material such as copper, aluminum, gold, or silver is preferably formed as the second conductive layer.

The pair of electrodes functioning as source and drain electrodes in the transistor 200 described in this embodiment is formed using electrodes including a low-resistance material such as copper, aluminum, gold, or silver, whereby the semiconductor device in which wiring delay is suppressed can be manufactured. Furthermore, the oxide semiconductor layer 106c functioning as a barrier layer is provided in contact with the pair of electrodes, whereby a reduction in electrical characteristics can be prevented, and thus it is possible to provide a semiconductor device having favorable electrical characteristics.

Figure 2A:
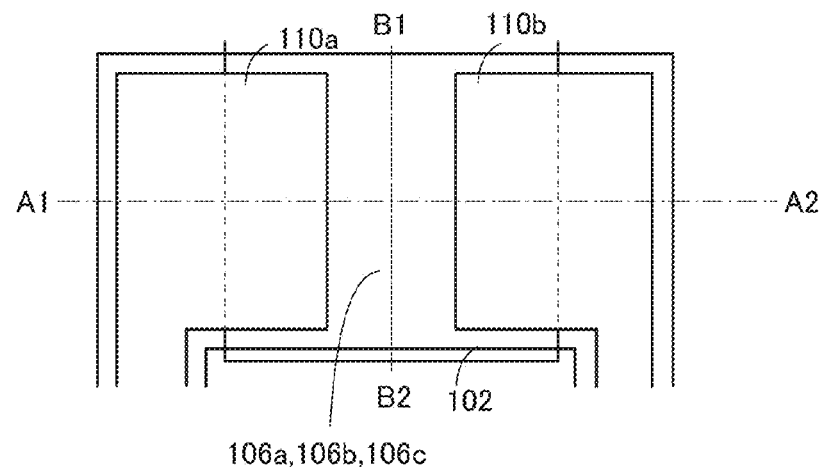
FIGS. 2A to 2C are a plan view and cross-sectional views of a transistor of one embodiment of the present invention.
Figure 2B:
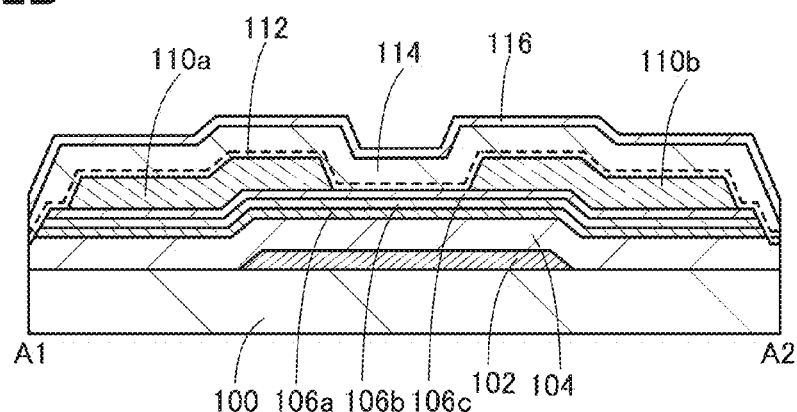
Figure 2C:
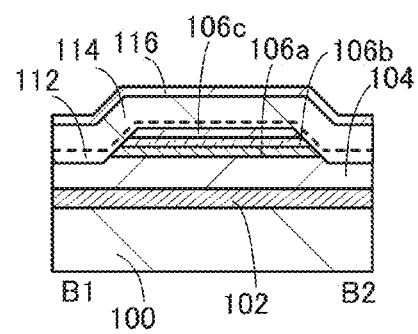

Note that the number of masks may be reduced by forming the electrodes 110a and 110b, the oxide semiconductor layer 106a, the oxide semiconductor layer 106b, and the oxide semiconductor layer 106c with the use of a half-tone mask (or a gray-tone mask, a phase difference mask, or the like), so that the number of processing steps may be reduced. In this case, a pattern is formed by, for example, ashing of a resist. Therefore, the oxide semiconductor layer 106a, the oxide semiconductor layer 106b, and the oxide semiconductor layer 106c are necessarily provided below the electrodes 110a and 110b. FIGS. 2A to 2C are a plan view and cross-sectional views of the structure in FIGS. 1A and 1B in the case where a half-tone mask is used in the manufacturing process.

Other constituent elements of the semiconductor device of this embodiment are described below in detail.

(Substrate)

There is no particular limitation on a material or the like of the substrate 100 as long as the material has heat resistance enough to withstand at least heat treatment to be performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 100. Furthermore, any of these substrates further provided with a semiconductor element may be used as the substrate 100. In the case where a glass substrate is used as the substrate 100, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Further alternatively, a flexible substrate may be used as the substrate 100, and the transistor 200 may be provided directly on the flexible substrate. Alternatively, a separation layer may be provided between the substrate 100 and the transistor 200. The separation layer can be used when part or the whole of a semiconductor device formed over the separation layer is separated from the substrate 100 and transferred onto another substrate. In that case, the transistor 200 can be transferred to a substrate having low heat resistance or a flexible substrate.

(Gate Electrode)

The gate electrode 102 can be formed using a metal element selected from chromium, copper, aluminum, gold, silver, zinc, molybdenum, tantalum, titanium, and tungsten; an alloy containing any of these metal elements as a component; an alloy containing any of these metal elements in combination; or the like. Further, one or more metal elements selected from manganese and zirconium may be used. Furthermore, the gate electrode 102 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode 102 can also be formed using a tight-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 102 and the gate insulating layer 104. These films each have a work function of 5 eV or higher, preferably 5.5 eV or higher, which is higher than the electron affinity of an oxide semiconductor; thus, the threshold voltage of a transistor including the oxide semiconductor can be shifted in the positive direction. Accordingly, a switching element having what is called normally-off characteristics is obtained. For example, in the case of using an In—Ga—Zn-based oxynitride semiconductor film, an In—Ga—Zn-based oxynitride semiconductor film having a higher nitrogen concentration than at least the oxide semiconductor layer 106a, specifically, an In—Ga—Zn-based oxynitride semiconductor film having a nitrogen concentration of 7 atomic % or higher is used.

(Gate Insulating Layer)

The gate insulating layer 104 can be formed to have a single-layer structure or a stacked-layer structure using, for example, one or more of silicon oxide, silicon oxynitride, silicon nitride oxide, silicon nitride, aluminum oxide, hafnium oxide, gallium oxide, and Ga—Zn-based metal oxide. Alternatively, the gate insulating layer 104 may be formed using a high-k material such as hafnium silicate (HfSiO$_x$), hafnium silicate (HfSi$_x$O$_y$) to which nitrogen is added, hafnium aluminate (HfAl$_x$O$_y$) to which nitrogen is added, hafnium oxide, or yttrium oxide, in which case gate leakage current of the transistor can be reduced.

The thickness of the gate insulating layer 104 is greater than or equal to 5 nm and less than or equal to 400 nm, preferably greater than or equal to 10 nm and less than or equal to 300 nm, more preferably greater than or equal to 50 nm and less than or equal to 250 nm.

An example of the stacked-layer structure of the gate insulating layer 104 is described. The gate insulating layer 104 contains, for example, oxygen, nitrogen, silicon, or hafnium. Specifically, it is preferable that the gate insulating layer 104 contain hafnium oxide, silicon oxide, or silicon oxynitride.

Hafnium oxide has a higher dielectric constant than silicon oxide and silicon oxynitride. Therefore, the physical thickness can be larger than the equivalent oxide thickness; thus, even in the case where the equivalent oxide thickness is less than or equal to 10 nm or less than or equal to 5 nm, leakage current due to tunnel current can be reduced. That is, it is possible to obtain a transistor with a low off-state current. Hafnium oxide having a crystal structure has a higher dielectric constant than hafnium oxide having an amorphous structure. Therefore, to obtain a transistor with a low off-state current, it is preferable to use hafnium oxide having a crystal structure. Examples of the crystal structure include a monoclinic crystal structure and a cubic crystal structure. Note that one embodiment of the present invention is not limited thereto.

The hafnium oxide having a crystal structure might have interface states due to defects. The interface states might function as trap centers. Therefore, in the case where the hafnium oxide is provided close to the channel region of the transistor, the electrical characteristics of the transistor might deteriorate owing to the interface states. Thus, to reduce the influence of the interface states, it is in some cases preferable to provide another layer between the channel region and the hafnium oxide in the transistor so that the channel region and the hafnium oxide is apart from each other. The layer has a buffering function. The layer having a buffering function may be included in the gate insulating layer 104 or may be included in the oxide semiconductor layer. In other words, silicon oxide, silicon oxynitride, an oxide semiconductor, or the like can be used for the layer having a buffering function. For example, a semiconductor or an insulator which has a larger energy gap than the semiconductor serving as the channel region is used for the layer having a buffering function. Alternatively, for example, a semiconductor or an insulator which has smaller electron affinity than the semiconductor serving as the channel region is used for the layer having a buffering function. Further alternatively, for example, a semiconductor or an insulator having larger ionization energy than the semiconductor serving as the channel region is used for the layer having a buffering function.

Meanwhile, charge is trapped by the interface states (trap centers) of the hafnium oxide having a crystal structure, whereby the threshold voltage of the transistor may be controlled in order that the charge stably exists, for example, an insulator having a larger energy gap than the hafnium oxide is provided as a buffer layer between the channel region and the hafnium oxide. Alternatively, a semiconductor or an insulator having smaller electron affinity than the hafnium oxide is provided. Further alternatively, a semiconductor or an insulator having larger ionization energy than the hafnium oxide is provided as the buffer layer. Use of such a semiconductor or an insulator inhibits discharge of the charge trapped by the interface states, so that the charge can be retained for a long time.

Examples of such an insulator include silicon oxide and silicon oxynitride. In order that the interface states in the gate insulating layer 104 capture charge, electrons need to be moved from the oxide semiconductor layer to the gate electrode 102. For a specific example, the potential of the gate electrode 102 may be kept at a potential higher than the potential of the pair of electrodes (the electrodes 110a and 110b) functioning as source and drain electrodes, for one second or longer, typically, one minute or longer tinder a high temperature (e.g., higher than or equal to 125° C. and lower than or equal to 450° C., typically higher than or equal to 150° C. and lower than or equal to 300° C.).

In the transistor in which a desired amount of electrons is captured by the interface states of the gate insulating layer 104 or the like in the above manner, the threshold voltage is shifted in the positive direction. The amount of captured electrons (the amount of change in the threshold voltage) can be controlled by adjustment of the voltage of the gate electrode 102 or the time for application of the voltage. Note that the film for capturing charge is not necessarily provided in the gate insulating layer 104 as long as it can capture charge. A stacked-layer film having a similar structure may be used for another insulating layer.

(Oxide Insulating Layer)

The oxide insulating layer 112 is an oxide insulating film through which oxygen is passed. Note that the oxide insulating layer 112 also functions as a film which relieves damage to the oxide semiconductor layer 106a, the oxide semiconductor layer 106b, and the oxide semiconductor layer 106c when the oxide insulating layer 114 formed later is formed.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating layer 112. Note that in this specification, "silicon oxynitride film" refers to a film that contains more oxygen than nitrogen, and "silicon nitride oxide film" refers to a film that contains more nitrogen than oxygen.

In addition, it is preferable that the number of defects in the oxide insulating layer 112 be small and typically, the spin density of a sinal that appears at g=2.001 due to a dangling bond of silicon be lower than or equal to $3\times10^{17}$ spins/cm$^3$ by electron spin resonance (ESR) measurement. This is because if the density of defects in the oxide insulating layer 112 is high, oxygen is bonded to the defects and the amount of oxygen that passes through the oxide insulating layer 112 is decreased.

Moreover, it is preferable that the amount of defects at the interface between the oxide insulating layer 112 and the oxide semiconductor layer 106c be small, typically the spin density corresponding to a signal which appears at g of greater than or equal to 1.89 and less than or equal to 1.96 due to an oxygen vacancy in the oxide semiconductor layer 106c be lower than or equal to $1\times10^{17}$ spins/cm$^3$, more preferably lower than or equal to the lower limit of detection by ESR measurement.

Note that all oxygen entering the oxide insulating layer 112 from the outside does not move to the outside of the oxide insulating layer 112 and some oxygen remains in the oxide insulating layer 112. Furthermore, movement of oxygen occurs in the oxide insulating layer 112 in some cases in such a manner that oxygen enters the oxide insulating layer 112 and oxygen contained in the oxide insulating layer 112 moves to the outside of the oxide insulating layer 112. When an oxide insulating film which is permeable to oxygen is formed as the oxide insulating layer 112, oxygen released from the oxide insulating layer 114 provided over the oxide insulating layer 112 can be moved to the oxide semiconductor layer 106a through the oxide insulating layer 112.

The oxide insulating layer 114 is formed in contact with the oxide insulating layer 112. The oxide insulating layer 114 is formed using an oxide insulating film whose oxygen content is in excess of that in the stoichiometric composition. Part of oxygen is released by heating from the oxide insulating film containing more oxygen than that in the stoichiometric composition. The oxide insulating film containing more oxygen than that in the stoichiometric composition is an oxide insulating layer of which the amount of released oxygen converted into oxygen atoms is greater than or equal to $1.0\times10^{13}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used for the oxide insulating layer 114.

It is preferable that the amount of defects in the oxide insulating layer 114 be small, and typically the spin density corresponding to a signal which appears at g=2.001 due to a dangling bond of silicon, be lower than $1.5\times10^{18}$ spins/cm$^3$, more preferably lower than or equal to $1\times10^1$ spins/cm$^3$ by ESR measurement. Note that the oxide insulating layer 114 is provided more apart from the oxide semiconductor layer 106a than the oxide insulating layer 112 is; thus, the oxide insulating layer 114 may have higher defect density than the oxide insulating layer 112.

(Nitride Insulating Layer)

It is possible to prevent outward diffusion of oxygen from the oxide semiconductor layer 106a and entry of hydrogen, water, and the like into the oxide semiconductor layer 106a from the outside by providing the nitride insulating layer 116 having a blocking effect against oxygen, hydrogen, water, alkali metal, alkaline earth metal, and the like over the oxide insulating layer 114. The nitride insulating layer is formed using silicon nitride, silicon nitride oxide, aluminum nitride, aluminum nitride oxide, or the like. Note that instead of the nitride insulating layer having a blocking effect against oxygen, hydrogen, water, alkali metal, alkaline earth metal, and the like, an oxide insulating layer having a blocking effect against oxygen, hydrogen, water, and the like, may be provided. As the oxide insulating layer having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

A variety of films, elements, and the like, such as a display element, an insulating layer (an inorganic insulating layer or an organic insulating layer), a pixel electrode, a common electrode, a counter substrate, and an alignment film can be provided over the nitride insulating layer 116.

An example of the case where a pixel electrode is provided over the nitride insulating layer 116 in FIGS. 1A and 1B is illustrated in FIGS. 3A to 3C. In FIG. 3C, an insulating layer 124 is provided between the nitride insulating layer 116 and a pixel electrode 120. The insulating layer 124 includes a film containing an organic resin, for example. Therefore, the insulating layer 124 has a function of pianarizing a surface of the pixel electrode 120. Note that the insulating layer 124 can be formed with a single layer or a stacked layer. The organic resin contains, for example, acrylic, polyimide, or polyamide.

An alignment film, a liquid crystal layer, a common electrode, a counter substrate, and the like are provided over the pixel electrode 120, whereby a display device can be formed.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferornetric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like.

Figure 4A:
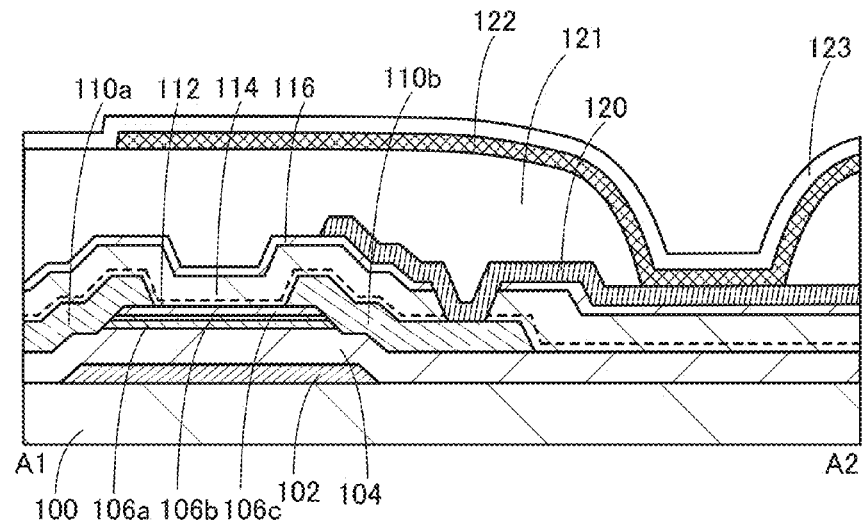
FIGS. 4A and 4B are cross-sectional views each illustrating a transistor of embodiment of the present invention.
Figure 4B:
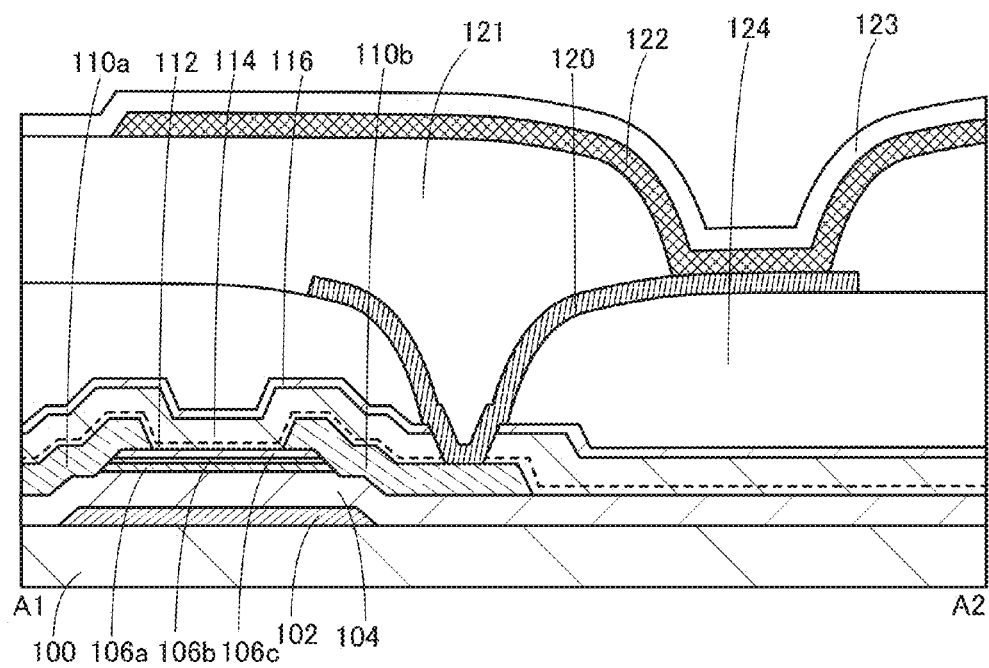

FIG. 4A illustrates an example of the case where a light-emitting element is provided in the structure of FIG. 3B. In a similar manner, FIG. 4B illustrates an example of the case where a light-emitting element is provided in the structure of FIG. 3C. The insulating layer 124 includes a film containing an organic resin. Therefore, the insulating layer 124 has a function of planarizing a surface of the pixel electrode 120. Note that the insulating layer 124 can be formed with a single layer or a stacked layer. An insulating layer is provided over the pixel electrode 120. The insulating layer 121 contains, for example, an organic resin. The organic resin contains, for example, acrylic, polyimide, or polyamide. The insulating layer 121 functions as a bank, for example. A light-emitting layer 122 includes an organic EL, layer and the like. A common electrode 123 has a function of reflecting light, and the pixel electrode 120 has a function of transmitting part of light. Thus, light can be emitted toward the substrate 100 (bottom emission). Alternatively, the common electrode 123 has a function of transmitting part of light, and the pixel electrode 120 has a function of reflecting light. Thus, light can be emitted toward a direction opposite to the substrate 100 (top emission). The light-emitting element includes the pixel electrode 120, the light-emitting layer 122, an EL element, and the common electrode 123, in the case where the light-emitting layer 122 includes an organic material, the light-emitting element can be regarded as having an organic EL element. Note that the pixel electrode 120 and the light-emitting element can be provided in other drawings in the same manner.

Figure 5A:
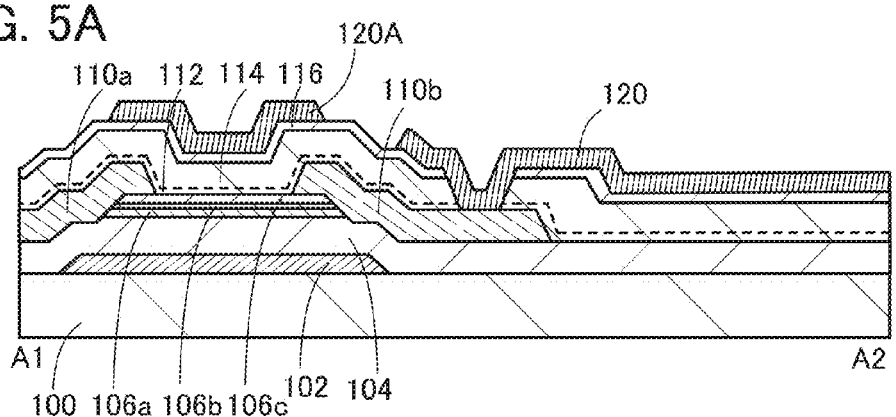
FIGS. 5A to 5C are cross-sectional views each illustrating a transistor of one embodiment of the present invention.
Figure 5B:
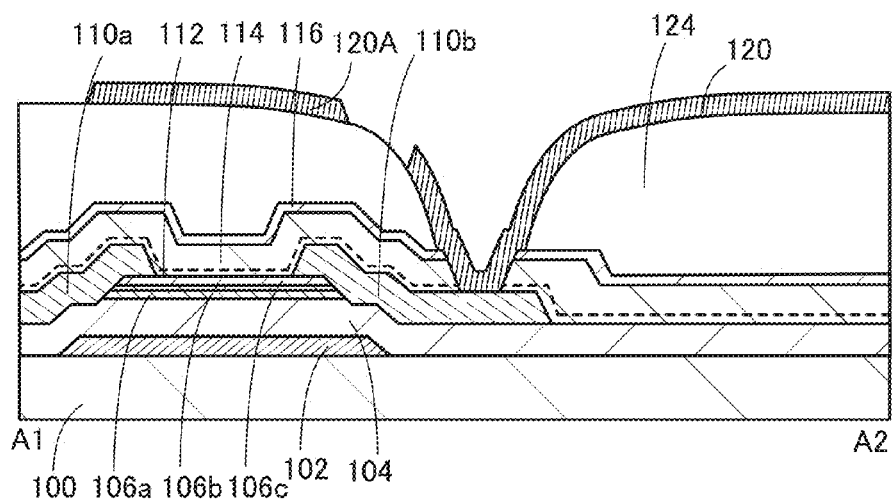
Figure 5C:
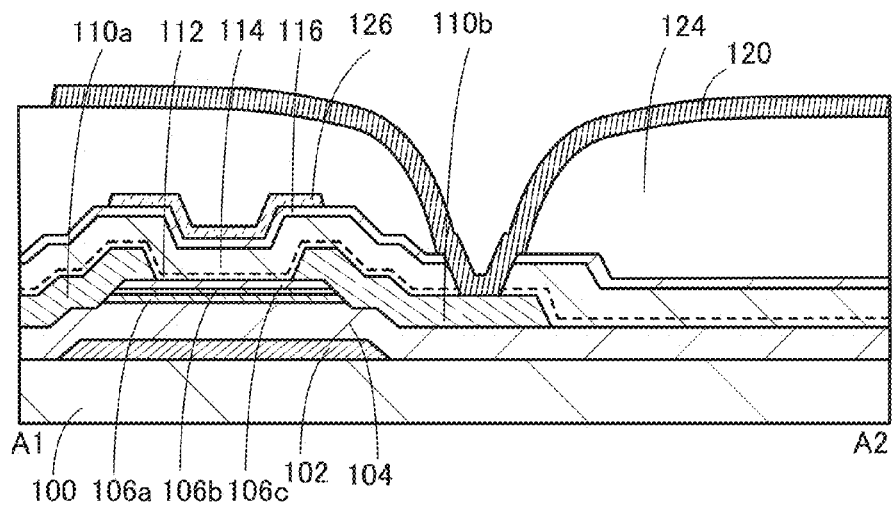
Figure 6:
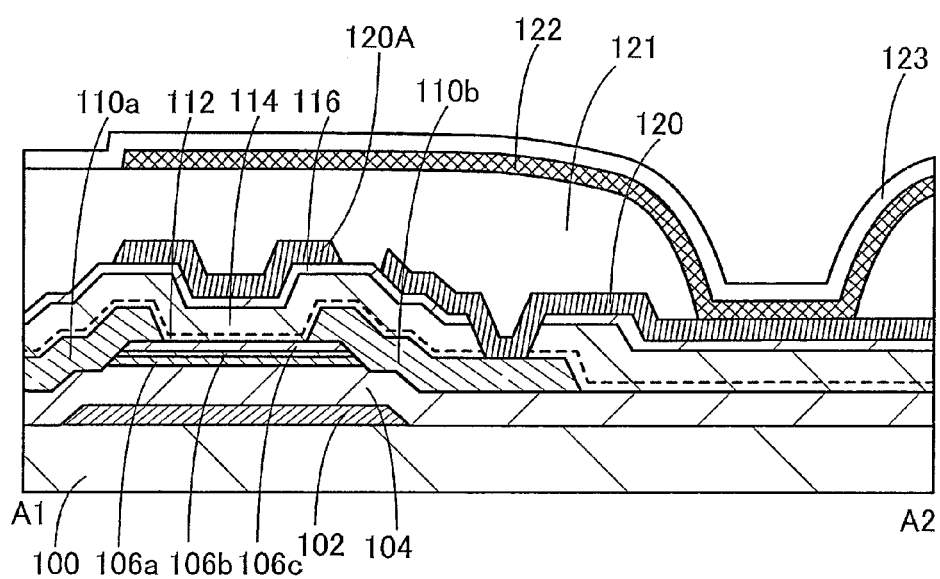
FIG. 6 is a cross-sectional view illustrating a transistor of one embodiment of the present invention.
Figure 7A:
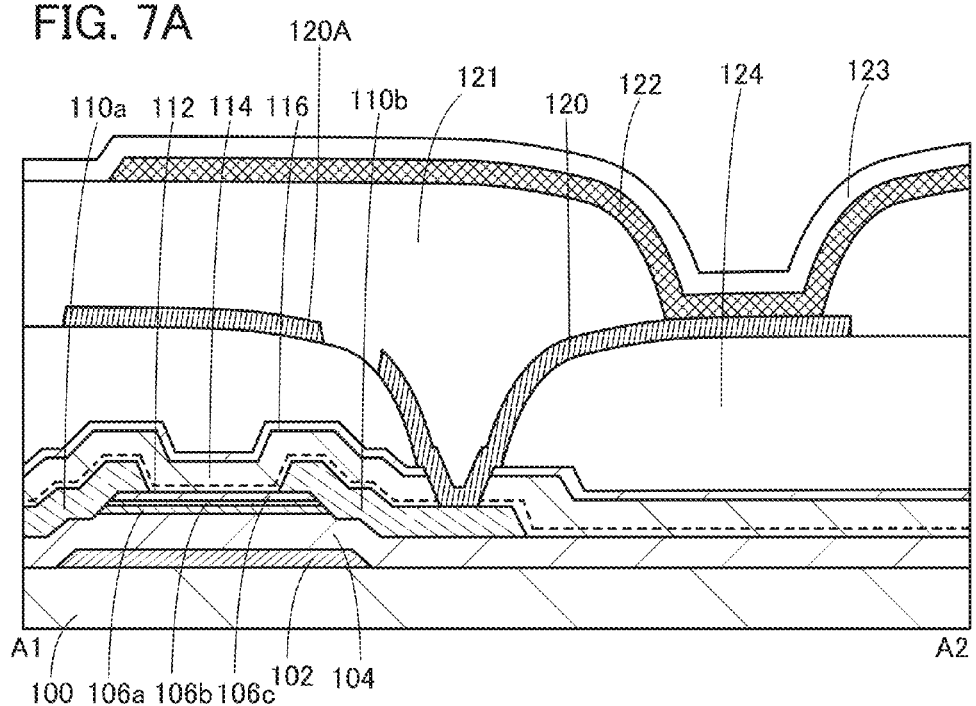
FIGS. 7A and 7B are cross-sectional views each illustrating a transistor of one embodiment of the present invention.
Figure 7B:
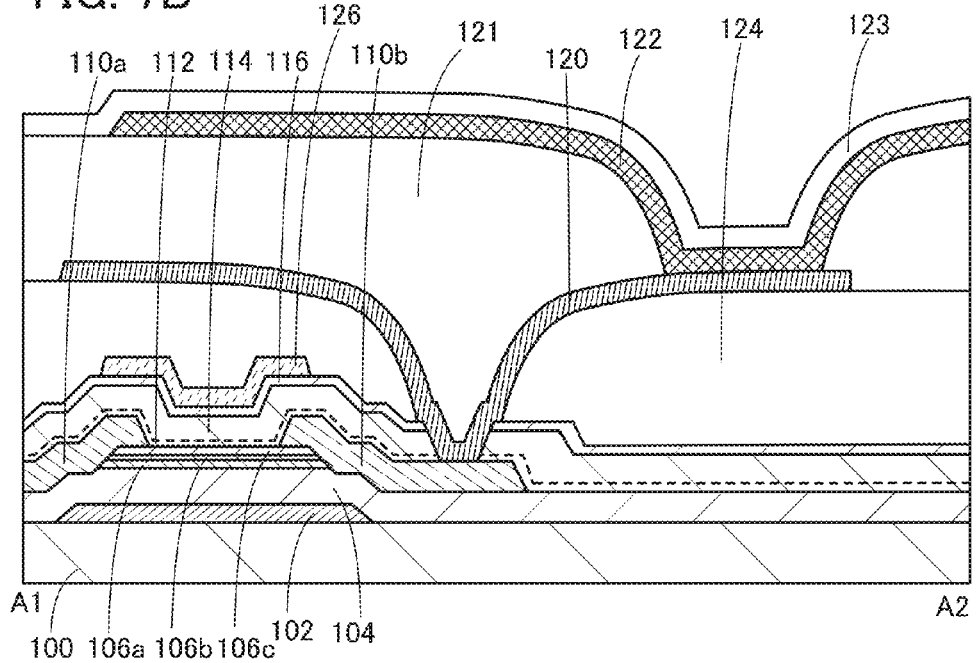

Another gate electrode may be provided in addition to the gate electrode 102. FIG. 5A and FIG. 6 illustrate examples in which a gate electrode 120A is provided in the respective structures of FIG. 3B and FIG. 4A. Note that the gate electrode 120A may be a film that is deposited and patterned by etching at the same time as the pixel electrode 120. Therefore, the gate electrode 120A may include the same material as the pixel electrode 120. In a similar manner, FIG. 5B and FIG. 7A illustrate examples in which the gate electrode 120A is provided in the respective structures of FIG. 3C and FIG. 4B. Note that a gate electrode 126 may be formed in a manufacturing step different from that of the pixel electrode 120. Examples in this case are illustrated in FIG. 5C and FIG. 7B. Note that the gate electrode 120A and the gate electrode 126 can be provided in other drawings in the same manner.

The gate electrode 102 may be connected to the gate electrode 120A or the gate electrode 126. As a result, the same signal or the same potential may be supplied thereto. Note that one embodiment of the present invention is not limited to this stricture. For example, different signals or different potentials may be supplied thereto.

Figure 8A:
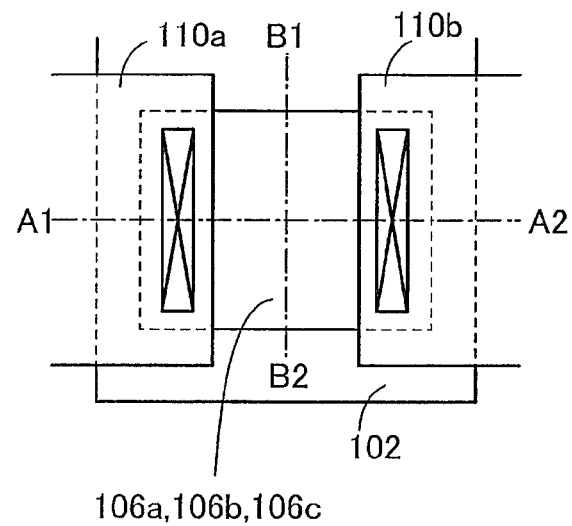
FIGS. 8A and 8B are a plan view and a cross-sectional view of a transistor of one embodiment of the present invention.
Figure 8B:
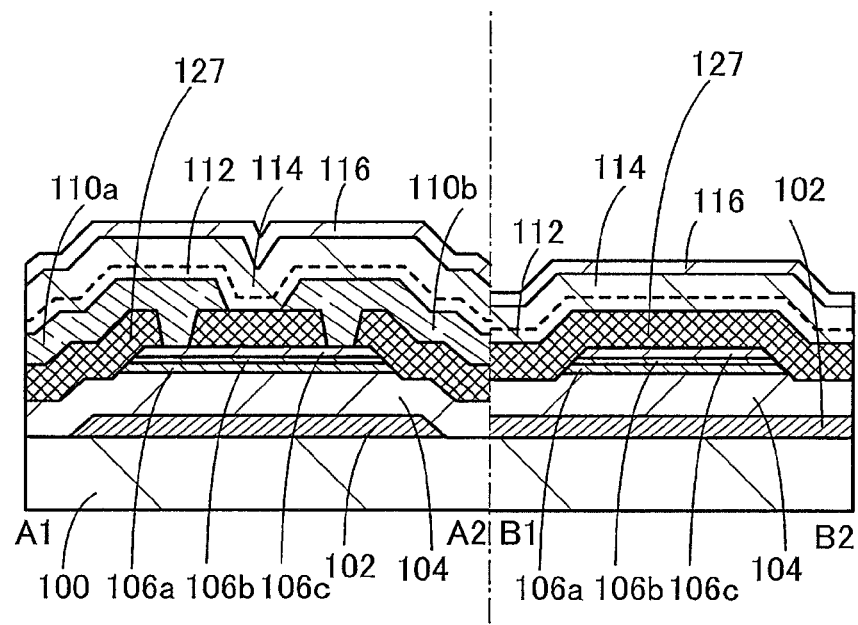

As illustrated in FIGS. 8A and 8B, an insulating layer 127 may be provided between the electrodes 110a and 110b and the oxide semiconductor layers 106a, 106b, and 106c. In this case, the electrode 110a (or the electrode 110b) is connected to the oxide semiconductor layer 106c through a contact hole. Note that the insulating layer 127 can be formed using a material similar to any of the materials of the gate insulating layer 104, the oxide insulating layer 114, and the oxide insulating layer 112 in the above description. Furthermore, the insulating layer 127 can be formed with a single layer or a stacked layer. Note that the gate electrode 120A and the gate electrode 126 can be provided in other drawings in the same manner.

<Structure Example 2 of Transistor>

Figure 9A:
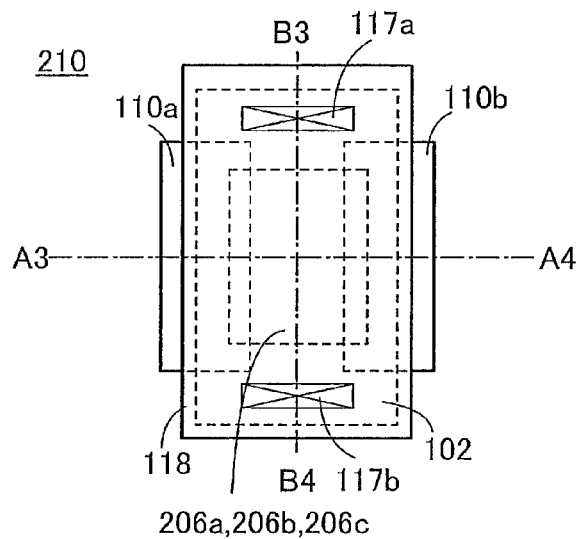
FIGS. 9A and 9B are a plan view and a cross-sectional view of a transistor of one embodiment of the present invention.
Figure 9B:
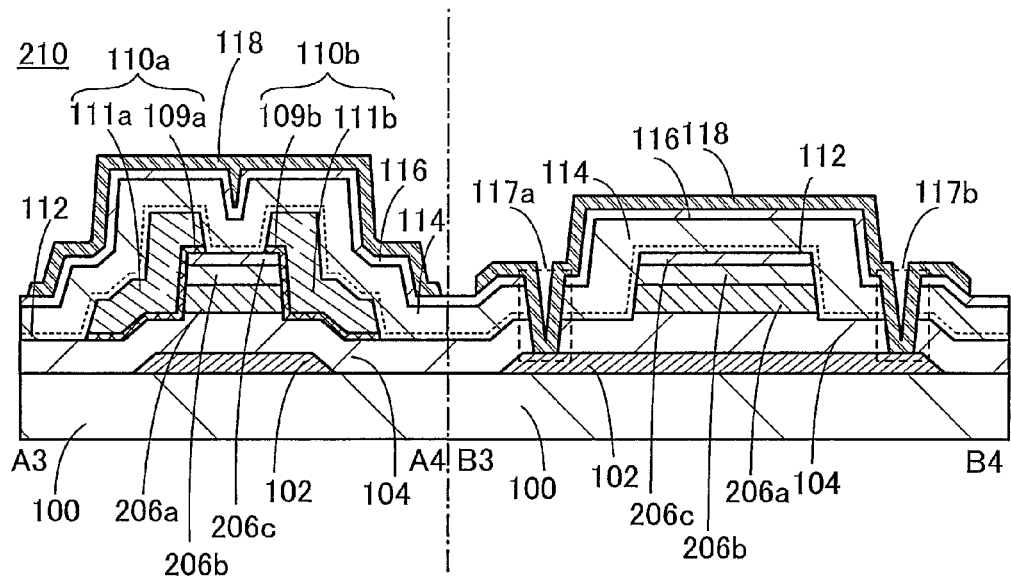

FIGS. 9A to 9B are a plan view and a cross-sectional view of a transistor 210 included in a semiconductor device of this embodiment. FIG. 9A is a plan view of the transistor 210, and FIG. 93 is a cross-sectional view taken along dashed dotted lines A3-A4 and B3-B4 in FIG. 9A. Note that the substrate 100 and some components (e.g., a gate insulating layer) of the transistor 210 are not illustrated in FIG. 9A for simplicity.

The transistor 210 illustrated in FIGS. 9A and 9B includes the gate electrode 102 formed over the substrate 100; the gate insulating layer 104 in contact with the gate electrode 102; an oxide semiconductor layer 206a facing the gate electrode 102 with the gate insulating layer 104 positioned therebetween; an oxide semiconductor layer 206b over the oxide semiconductor layer 206a; an oxide semiconductor layer 206c over the oxide semiconductor layer 206b; the pair of electrodes (the electrodes 110a and 110b) in contact with the oxide semiconductor layer 206c; the oxide insulating layer 112, the oxide insulating layer 114, and the nitride insulating layer 116 formed over the pair of electrodes (the electrodes 110a and 110b) and the oxide semiconductor layer 206c; and an electrode 118 provided over the nitride insulating layer 116.

The electrode 118 functions as a back gate electrode in the transistor 210. A stacked-layer structure that includes the oxide insulating layer 112, the oxide insulating layer 114, and the nitride insulating layer 116 and is provided between the electrode 118 and the oxide semiconductor layer 206a functions as a gate insulating layer for the back gate electrode. The electrode 118 is connected to the gate electrode 102 through opening portion 117a and the opening portion 117b formed in the gate insulating layer 104, the oxide insulating layer 112, the oxide insulating layer 114, and the nitride insulating layer 116. Therefore, the same potential is applied to the electrode 118 and the gate electrode 102.

The transistor 210 in FIGS. 9A and 9B is different from the transistor 200 in FIGS. 1A and 1B in that the electrode 118 functioning as a back gate electrode is provided over the nitride insulating layer 116. The other structures are the same as those of the transistor 200 and the effect similar to that in the case of the transistor 200 can be obtained. That is, the transistor 210 includes the oxide semiconductor layer 206c which functions as a barrier layer and which is positioned between the pair of electrodes (the electrodes 110a and 110b) containing a low-resistance material and the oxide semiconductor layer 206a where a channel is formed. Thus, entry and diffusion of impurities to the oxide semiconductor layer 206a can be prevented. Thus, a reduction in the electrical characteristics is inhibited in the transistor 210. For details of every component in the transistor 210, the description of the transistor 200 can be referred to.

The oxide semiconductor layer 206a included in the transistor 210 in FIGS. 9A and 9B is formed using the same material as the oxide semiconductor layer 106a included in the transistor 200, and has a thickness greater than or equal to 100 nm, for example, greater than or equal to 100 nm and less than or equal to 1000 nm, preferably greater than or equal to 200 nm and less than or equal to 1000 nm. The oxide semiconductor layer 206b is formed using a material similar to that of the oxide semiconductor layer 106b included in the transistor 200, and the oxide semiconductor layer 206c is formed using a material similar to that of the oxide semiconductor layer 106c included in the transistor 200. The channel length of the transistor 210 (the distance between the electrodes 110a and 110b) is preferably greater than or equal to 0.5 μm and less than or equal to 2 μm, further preferably greater than or equal to 0.5 μm and less than or equal to 1 μm.

As illustrated in the cross-sectional view of FIG. 9B, the oxide semiconductor layer 206a faces each of the gate electrode 102 and the electrode 118 (back gate electrode) to be positioned between the two electrodes. The lengths in the channel length direction and the channel width direction of the electrode 118 functioning as a back gate electrode are longer than those of the oxide semiconductor layer 206a, respectively. The whole oxide semiconductor layer 206a is covered with the electrode 118 with the insulating layers (the oxide insulating layer 112, the oxide insulating layer 114, and the nitride insulating layer 116) positioned therebetween. Furthermore, since the electrode 118 and the gate electrode 102 are connected to each other through the opening portion 117a and the opening portion 117b formed in the gate insulating layer 104, the oxide insulating layer 112, the oxide insulating layer 114, and the nitride insulating layer 116, side surfaces of the oxide semiconductor layer 206a in the channel width direction face the back gate electrode (electrode 118) with the insulating layers (the oxide insulating layer 112, the oxide insulating layer 114, and the nitride insulating layer 116) positioned therebetween.

Such a structure enables electric fields of the gate electrode 102 and the electrode 118 to electrically surround the oxide semiconductor layer 206a included in the transistor 210. A device structure of a transistor, like that of the transistor 210, in which electric fields of a gate electrode and a back gate electrode electrically surround an oxide semiconductor layer where a channel is formed can be referred to as a surrounded channel (s-channel) structure.

Since the transistor 210 has the s channel structure, an electric field for inducing a channel can be effectively applied to the oxide semiconductor layer 206a by the gate electrode 102; therefore, the current drive capability of the transistor 210 can be improved and high on-state current characteristics can be obtained. Since the on-state current can be increased, it is possible to reduce the size of the transistor 210. Furthermore, since the transistor 210 has a structure in which the channel is surrounded by the gate electrode 102 and the electrode 118, the mechanical strength of the transistor 210 can be increased.

Note that in the structure of the transistor 210, any one of the opening portions 117a and 117b may be formed, and the electrode 118 and the gate electrode 102 may be connected to each other through the opening portion.

Note that the pair of electrodes (the electrode 110a and 110b) included in the transistor 210 has stacked-layer structures including first conductive layers 109a and 109b and second conductive layers 111a and 111b. Any of the materials given in the description of the first layer of the electrodes 110a and 110b can be used for the first conductive layers 109a and 109b, as appropriate. In addition, any of the materials given in the description of the second layer of the electrodes 110a and 110b can be used for the second conductive layers 111a and 111b, as appropriate. Note that the structure of the pair of electrodes (the electrodes 110a and 110b) of the transistor 210 is not limited to that illustrated in FIGS. 9A and 9B as long as the pair of electrodes (the electrodes 110a and 110b) contain copper, aluminum, gold, or silver, and may be a single-layer structure or a stacked-layer structure of three layers or more.

<Structure Example 3 of Transistor>

Figure 10A:
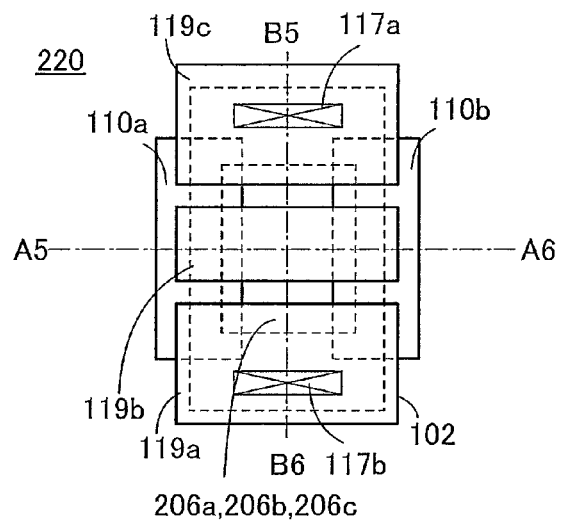
FIGS. 10A and 10B are a plan view and a cross-sectional view of a transistor of one embodiment of the present invention.
Figure 10B:
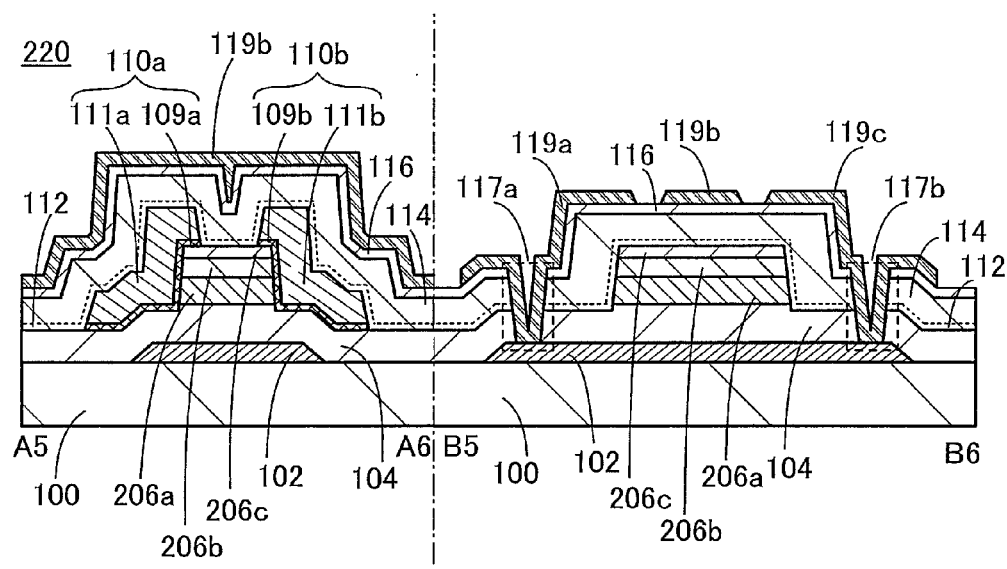

FIGS. 10A to 10B are a plan vim and a cross-sectional view of a transistor 220 included in a semiconductor device of this embodiment. The transistor 220 is a modification example of the transistor 210 in FIGS. 9A and 9B. FIG. 10A is a plan view of the transistor 220, and FIG. 10B is a cross-sectional view taken along dashed dotted lines A5-A6 and B5-B6 in FIG. 10A. Note that the substrate 100 and some components (e.g., agate insulating layer) of the transistor 220 are not illustrated in FIG. 10A for simplicity.

The transistor 220 illustrated in FIGS. 3A and 33 includes the gate electrode 102 formed over the substrate 100; the gate insulating layer 104 in contact with the gate electrode 102; the oxide semiconductor layer 206a facing the gate electrode 102 with the gate insulating layer 104 positioned therebetween; the oxide semiconductor layer 206b over the oxide semiconductor layer 206a; the oxide semiconductor layer 206c functioning as a barrier layer and provided over the oxide semiconductor layer 206b; the pair of electrodes (the electrodes 110a and 110b) in contact with the oxide semiconductor layer 206c; the oxide insulating layer 112, the oxide insulating layer 114, and the nitride insulating layer 116 formed over the pair of electrodes (the electrodes 110a and 110b) and the oxide semiconductor layer 206c: and electrodes 119a, 119b, and 119c formed over the nitride insulating layer 116.

In the transistor 220, the electrode 119b, which overlaps the oxide semiconductor layer 206a with the oxide semiconductor layer 206b, the oxide semiconductor layer 206c, and the insulating layers (the oxide insulating layer 112, the oxide insulating layer 114, and the nitride insulating layer 116) positioned therebetween, functions as a back gate electrode. The electrodes 119a and 119e, which are formed in the same layer as the electrode 119b, are connected to the gate electrode 102, through the opening portions 117a and 117b, respectively, which are formed in the gate insulating layer 104, the oxide insulating layer 112, the oxide insulating layer 114, and the nitride insulating layer 116. That is, the electrodes 119a and 119c function as part of the gate electrode 102.

The transistor 220 is different from the transistor 210 in that the electrode 118, which functions as a back gate electrode in the transistor 210, is separated. The other components of the transistor 220 can be similar to those of the transistor 210. The description of the transistor 210 can be referred to for details of the structure of the transistor 220.

The electrodes 119a and 119c included in the transistor 220 have regions which overlap the oxide semiconductor layer 206a when seen from the above, and face the side surfaces of the oxide semiconductor layer 206a in the opening portions 117a and 117b. Thus, like the transistor 210, the transistor 220 also has an s-channel structure in which the oxide semiconductor layer 206a is electrically surrounded by the gate electrode 102 and the electrodes 119a, 119b, and 119c; therefore, an electric field for inducing a channel can be effectively applied to the oxide semiconductor layer 206a by the gate electrode 102. Accordingly, the current drive capability of the transistor 220 is increased, so that high on-state current can be obtained.

Furthermore, since the electrode 119b functioning as a back gate electrode is not electrically connected to the gate electrode 102 in the transistor 220, different potentials or signals can be input to the gate electrode 102 and the electrode 119b. Therefore, by a signal or potential input to the electrode 119b functioning as a back gate electrode, the threshold voltage of the transistor 220 can be shifted in the positive or negative direction. In the operation period of the semiconductor device, the transistor 220 can be changed to an enhancement-type or depression-type transistor, as appropriate by appropriate control of the threshold voltage of the transistor 220.

<Structure Example 4 of Transistor>

Figure 11A:
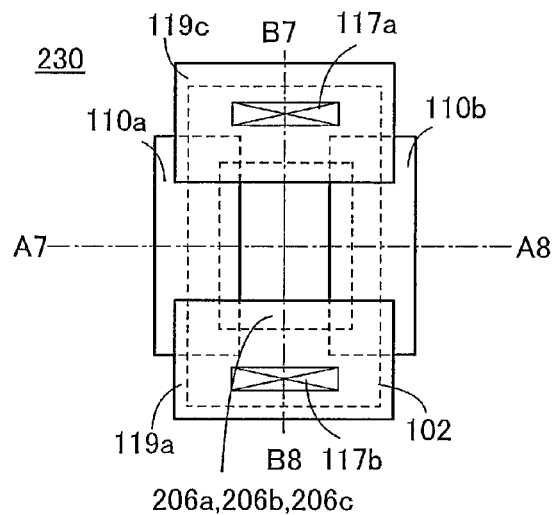
FIGS. 11A and 11B are a plan view and a cross-sectional view of a transistor of one embodiment of the present invention.
Figure 11B:
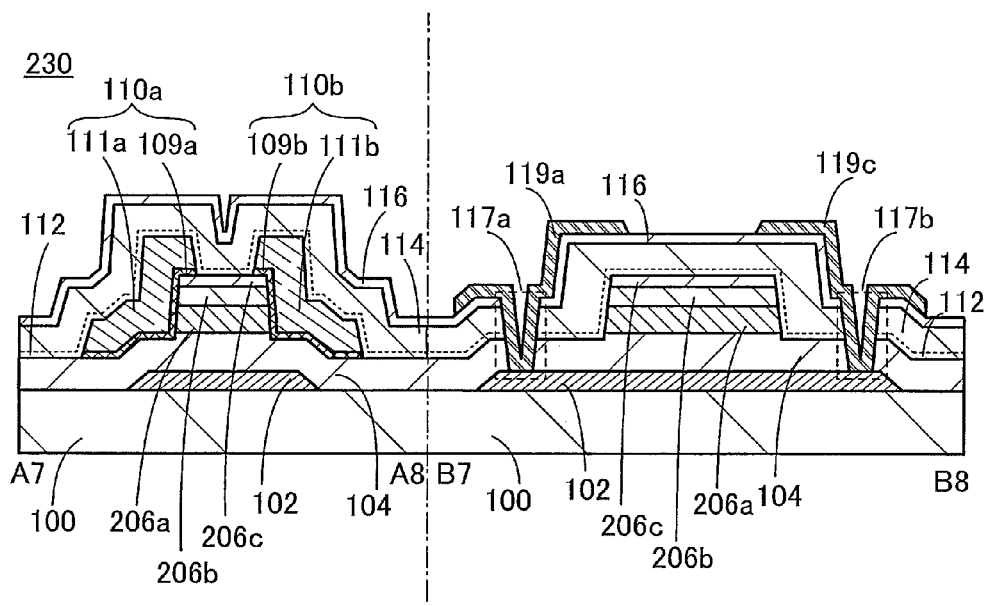

FIGS. 11A to 11B are a plan view and a cross-sectional view of a transistor 230 included in a semiconductor device of this embodiment. The transistor 230 is a modification example of the transistors 210 and 220 in FIGS. 9A and 9B and FIGS. 10A and 10B. FIG. 11A is a plan view of the transistor 230, and FIG. 11B is a cross-sectional view taken along dashed dotted lines A7-A8 and B7-B8 in FIG. 11A. Note that the substrate 100 and some components (e.g., a gate insulating layer) of the transistor 230 are not illustrated in FIG. 11A for simplicity.

The transistor 230 illustrated in FIGS. 11A and 11B includes the gate electrode 102 formed over the substrate 100; the gate insulating layer 104 in contact with the gate electrode 102; the oxide semiconductor layer 206a facing the gate electrode 102 with the gate insulating layer 104 positioned therebetween; the oxide semiconductor layer 206b over the oxide semiconductor layer 206a; the oxide semiconductor layer 206c functioning as a barrier layer and provided over the oxide semiconductor layer 206b; the pair of electrodes (the electrodes 110a and 110b) in contact with the oxide semiconductor layer 206c; the oxide insulating layer 112, the oxide insulating layer 114, and the nitride insulating layer 116 formed over the pair of electrodes (the electrodes 110a and 110b) and the oxide semiconductor layer 206c; and the electrodes 119a and 119c formed over the nitride insulating layer 116.

The transistor 230 includes the electrodes 119a and 119c, which have regions overlapping the oxide semiconductor layer 206a with the oxide semiconductor layer 206b, the oxide semiconductor layer 206c, and the insulating layers (the oxide insulating layer 112, the oxide insulating layer 114, and the nitride insulating layer 116) positioned therebetween. The electrodes 119a and 119c are connected to the gate electrode 102 through the opening portions 117a and 117b, respectively, which are formed in the gate insulating layer 104, the oxide insulating layer 112, the oxide insulating layer 114, and the nitride insulating layer 116, and the electrodes 119a and 119c function as part of the gate electrode 102. That is, the transistor 230 has the structure of the transistor 220 in which the electrode 119b functioning as a back gate electrode is omitted. Note that only one of the electrodes 119a and 119c may be provided in each of the transistor 220 and the transistor 230.

The transistor 230 also includes the gate electrodes (the gate electrode 102 and the electrodes 119a and 119c) that face the bottom surface and two facing side surfaces of the oxide semiconductor layer 206a; therefore, like the transistors 210 and 220, the transistor 230 also has an s-channel structure in which the oxide semiconductor layer 206a is electrically surrounded. Therefore, the current drive capability of the transistor 230 is improved, so that the transistor 230 can have high on-state current. The descriptions of the transistors 210 and 220 can be referred to for details of every components of the transistor 230.

<Structure Example 5 of Transistor>

Figure 12:
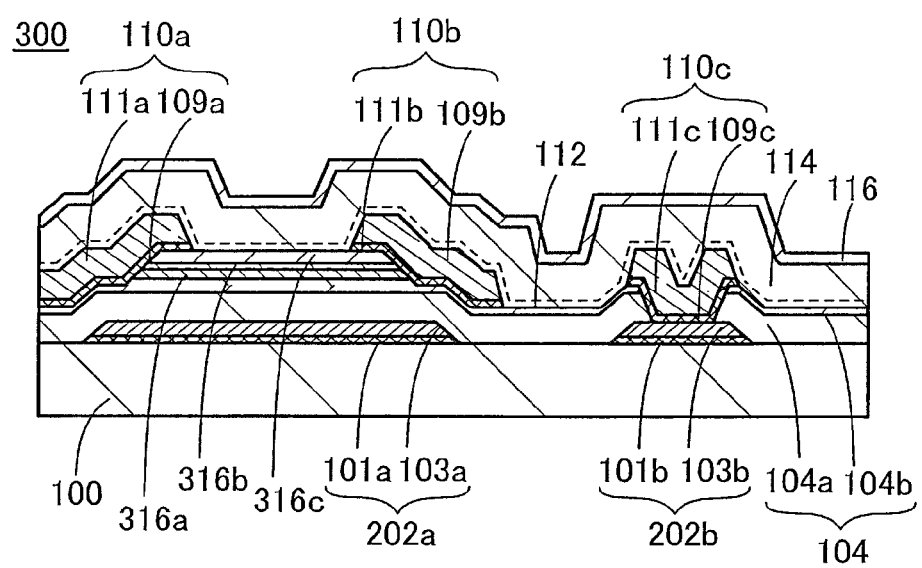
FIG. 12 is a cross-sectional view illustrating a transistor of one embodiment of the present invention.

FIG. 12 illustrates a transistor 300 included in the semiconductor device of embodiment. Note that FIG. 12 illustrates a cross section of the transistor 300 in the channel length direction and a cross section of a connection portion between an electrode 202b which is formed in the same layer as a gate electrode 202a and an electrode 110e which is formed in the same layer as the pair of electrodes (the electrodes 110a and 110b).

In the transistor 300 in FIG. 12, the gate electrode 202a and the electrode 202b that s formed in the same layer as the gate electrode 202a have a stacked-layer structure including a first conductive layer 101a and a second conductive layer 103a, and a stacked-layer structure including a first conductive layer 101b and a second conductive layer 103b, respectively. A material similar to that of the first conductive layers 109a and 109b of the pair of electrodes (the electrodes 110a and 110b) can be used for the first conductive layers 101a and 101b. A material similar to that of the second conductive layers 111a and 111b of the pair of electrodes (the electrodes 110a and 110b) can be used for the second conductive layers 103a and 103b.

When the gate electrode 202a and the electrode 202b are formed to contain a low-resistance material such as copper, aluminum, gold, or silver, it is possible to manufacture a semiconductor device with reduced wiring delay even in the case of using a large-sized substrate as the substrate 100. Note that in the case where electrodes containing any of the above low-resistance materials are formed as the gate electrode 202a and the electrode 202b, it is preferable that the gate insulating layer 104 have a stacked-layer structure including a nitride insulating layer 104a and an oxide insulating layer 104b and that the oxide insulating layer 104b be in contact with an oxide semiconductor layer 316a. The nitride insulating layer 104a included in the gate insulating layer 104 can be used as a barrier layer for preventing diffusion of the low-resistance material. The oxide insulating layer 104b prevents diffusion of nitrogen from the nitride insulating layer 104a to the oxide semiconductor layer 316a and an oxide semiconductor layer 316b and functions as a supply source of oxygen for the oxide semiconductor layers 316a and 316b.

The structure of the oxide semiconductor layer 316a included in the transistor 300 can be similar to that of the oxide semiconductor layer 106a of the transistor 200; therefore, the above description can be referred to. The structure of the oxide semiconductor layer 316b can be similar to that of the oxide semiconductor layer 106b of the transistor 200; therefore, the above description can be referred to. The structure of an oxide semiconductor layer 316c can be similar to that of the oxide semiconductor layer 106c of the transistor 200; therefore, the above description can be referred to. Therefore, in the band structure in the thickness direction of the stacked-layer structure in the transistor 300, which includes the gate insulating layer 104, the oxide semiconductor layer 316a, the oxide semiconductor layer 316b, the oxide semiconductor layer 316c, and the oxide insulating layer 112, the oxide semiconductor layer 316a serves as a well; thus, the channel region is formed in the oxide semiconductor layer 316a in the transistor including the stacked-layer structure.

Note that the connection between the electrode 202b and the electrode 110c in the transistor 300 is formed in such a manner that a metal oxide film and an oxide semiconductor film are processed into an island shape, and an opening portion is formed in the gate insulating layer 104 to expose the electrode 202b. After that, a conductive film to be the pair of electrodes (the electrodes 110a and 110b) and the electrode 110c is formed and processed, whereby the electrode 202b and the electrode 110c can be connected to each other.

<Structure Example 6 of Transistor>

Figure 13A:
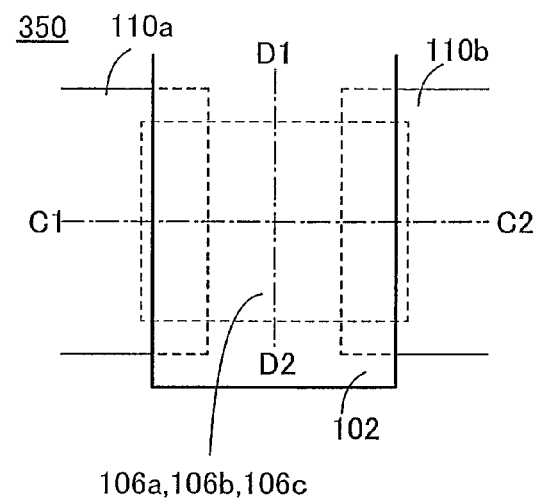
FIGS. 13A and 13B are a plan view and a cross-sectional view of a transistor of one embodiment of the present invention.
Figure 13B:
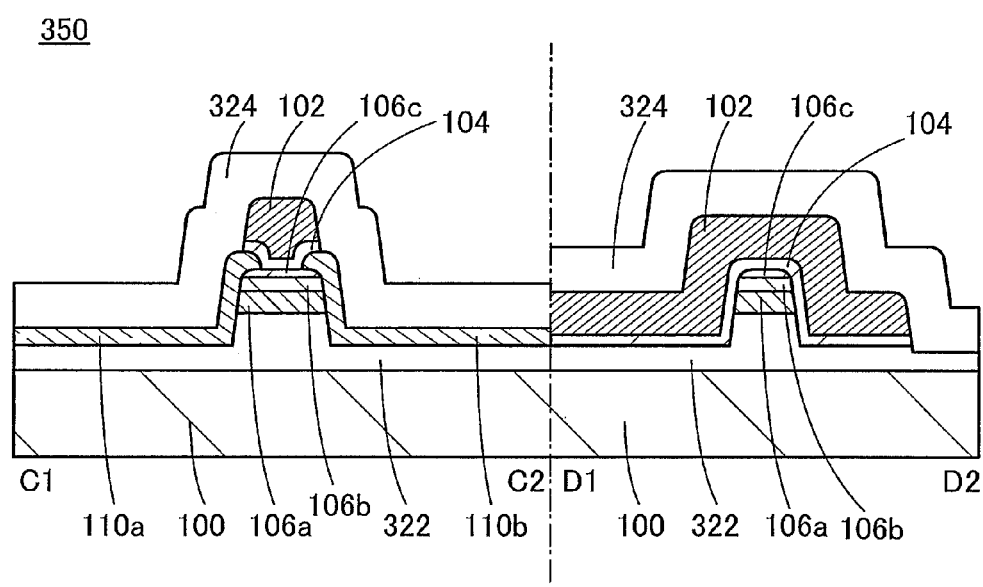

In the above transistor structures, a bottom-gate structure is employed; however, a top-gate structure can also be employed. FIGS. 13A and 13B are a plan view and a cross-sectional view of a transistor 350 included in the semiconductor device of this embodiment. FIG. 13A is a top view of the transistor 350 and FIG. 13B is a cross-sectional view taken along dashed-dotted lines C1-C2 and D1-D2 in FIG. 13A. Note that the substrate 100 and some components (e.g., a gate insulating layer) of the transistor 350 are not illustrated in FIG. 13A for simplicity.

The transistor 350 illustrated in FIGS. 13A and 13B includes a base insulating layer 322 having a projection portion over the substrate 100; the oxide semiconductor layer 106a over the projection portion of the base insulating layer 322; the oxide semiconductor layer 106b over the oxide semiconductor layer 106a; the oxide semiconductor layer 106c functioning as a barrier layer over the oxide semiconductor layer 106b; the pair of electrodes (the electrodes 110a and 110b) in contact with the oxide semiconductor layer 106c; the gate insulating layer 104 and the gate electrode 102 formed over the pair of electrodes (the electrodes 110a and 110b) and the oxide semiconductor layer 106c; and an oxide insulating layer 324 over the pair of electrodes (the electrodes 110a and 110b) and the gate electrode 102.

The structure of the base insulating layer 322 can be similar to that of the gate insulating layer 104 of the transistor 200. The structure of the oxide insulating layer 324 can be similar to those of the oxide insulating layer 112 and the oxide insulating layer 114 of the transistor 200. The descriptions of the transistors 210, 220, and the like can be referred to for details of every component of the transistor 350.

In fabricating a transistor with a small channel length and a small channel width, an electrode, a semiconductor film, or the like is processed while a resist mask is reduced in size and consequently has a round end portion (curved surface) in some cases as illustrated in FIGS. 13A and 13B. Such a structure can improve coverage with a film deposited over the electrode or the semiconductor film having a rounded edge portion.

Note that the structure example of the bottom-gate transistor described above can also be referred to for the top-gate transistor.

The structure described in this embodiment makes it possible to obtain a highly reliable transistor in which the impurity concentration of an oxide semiconductor layer including the channel formation region is reduced. Furthermore, the channel is less likely to be influenced by the interface state in the structure, so that a reduction in on-state current due to the interface state is less likely to occur. Accordingly, the transistor can have high on-state current and small S-value. In addition, a change in electrical characteristics due to the interface state is less likely to occur in the transistor, whereby the transistor has high reliability.

Note that the structures of the transistors of this embodiment can be freely combined with each other.

<Method for Manufacturing Transistor>

A method for manufacturing the transistor of this embodiment is described using FIGS. 14A to 14D and FIGS. 15A to 15C. Note that a method for manufacturing the transistor 210 is described below as a typical example.

First, a conductive film is formed over the substrate 100 and processed through a photolithography process to form the gate electrode 102. Next, the gate insulating layer 104 is formed over the gate electrode 102 (see FIG. 14A).

The conductive film to be the gate electrode 102 can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma chemical vapor deposition (PECVD) method, a thermal CND method such as a metal organic chemical vapor deposition (MOCVD) method or an atomic layer deposition (ALD) method may be used.

A thermal CVD method is a deposition method in which deposition may be performed in such a manner that the pressure in a chamber is set to an atmospheric pressure or a reduced pressure, and a source gas and an oxidizer are supplied to the chamber at the same time and react with each other in the vicinity of the substrate or over the substrate to be deposited over the substrate. A thermal CND method has an advantage that no defect due to plasma damage is generated since it does not utilize plasma for deposition.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

In this embodiment, a glass substrate is used as the substrate 100, and a 100-nm-thick tungsten layer is formed as the gate electrode 102 by a sputtering method.

Note that for example, in the case where a tungsten layer is formed using a deposition apparatus utilizing ALD, a $WF_6$ gas and a $B_2H_6$ gas are sequentially introduced a plurality of times to form an initial tungsten layer, and then a $WF_6$ gas and an $H_2$ gas are introduced at a time, so that a tungsten layer is thrilled. Note that an $SiH_4$ gas may be used instead of a $B_2H_6$ gas.

The gate insulating layer 104 can be formed by a sputtering method, a PECVD method, a thermal CVD method, a vacuum evaporation method, a PLD method, or the like. Here, a stack including a 400-nm-thick silicon nitride film and a 50-nm-thick silicon oxynitride film is formed as the gate insulating layer 104 by a PECVD method.

Alternatively, a film to be the gate insulating layer 104 may be formed by a thermal CVD method. For example, in the case where a hafnium oxide film is formed, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed, two kinds of gases, e.g., $H_2O$ as an oxidizer and a source gas which is obtained by vaporizing liquid containing a solvent and an aluminum precursor compound trimethylaluminum (TMA)) are used. Note that the chemical formula of trimethylaluminium is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed, hexachlorodisilane is adsorbed on a deposition surface, chlorine contained in the adsorbate is removed, and radicals of an oxidizing gas (e.g., 2 or dinitrogen monoxide) are supplied to react with the adsorbate.

Figure 14A:
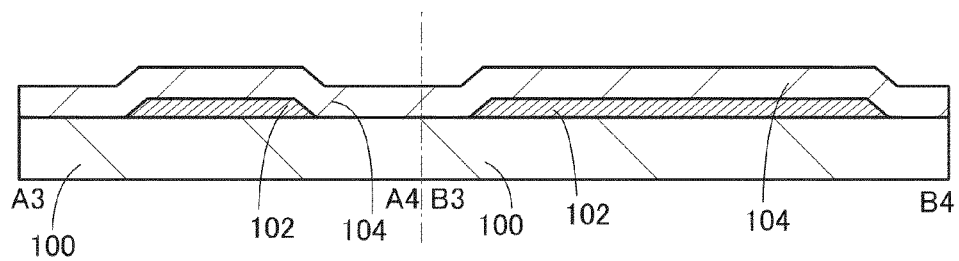
FIGS. 14A to 14D are cross-sectional views illustrating a manufacturing process of a transistor of one embodiment of the present invention.
Figure 14B:
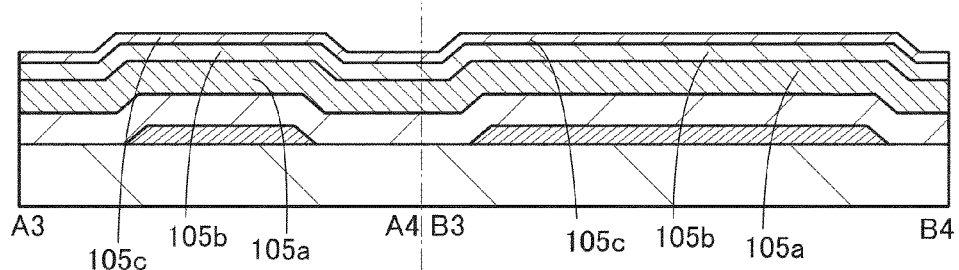

Next, a stack including an oxide semiconductor film 105a, an oxide semiconductor film 105b, and an oxide semiconductor film 105c which are to be the oxide semiconductor layer 106a, the oxide semiconductor layer 106b, and the oxide semiconductor layer 106c, respectively, is formed over the gate insulating layer 104 (see FIG. 14B).

In this embodiment, an In—Ga—Zn oxide film is formed as the oxide semiconductor film 105a by a sputtering method using an In—Ga—Zn oxide target (In:Ga:Zn=1:1:1). Furthermore, an In—Ga—Zn oxide film is formed as the oxide semiconductor film 105c by a sputtering method using an In—Ga—Zn oxide target (In:Ga:Zn=1:3:2). Moreover, an In—Ga—Zn oxide film is formed as the oxide semiconductor film 105e by a sputtering method using an In—Ga—Zn oxide target (In:Ga:Zn=1:3:6). Note that the constituent elements and compositions applicable to the oxide semiconductor film 105a, the oxide semiconductor film 105b, and the oxide semiconductor film 105c are not limited thereto.

In the case where the oxide semiconductor film 105a, the oxide semiconductor 105b, and the oxide semiconductor film 105c are formed by a sputtering method, a power supply device for generating plasma can be an RF power supply device, an AC power supply device, a DC power supply device, or the like as appropriate. Note that it is preferable to use DC discharge applicable to a large-sized substrate in deposition because the productivity of the semiconductor device can be increased.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

A chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 105a, as much as possible. Alternatively, a turbo molecular pump and a cold trap are preferably combined so as to prevent a backflow of a gas, especially a gas containing carbon or hydrogen from an exhaust system to the inside of the chamber. It is preferable to remove impurities such as water contained in the oxide semiconductor film 105b and the oxide semiconductor film 105c, which are in contact with the oxide semiconductor film 105a, as much as possible; therefore, a chamber for depositing the oxide semiconductor film 105b and the oxide semiconductor film 105c is preferably evacuated to be a high vacuum state.

In order to obtain a highly purified intrinsic or substantially highly purified intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, −80° C. or lower, −100° C. or lower, or −120° C. or lower is used, whereby entry of moisture or the like into the oxide semiconductor film 105a, the oxide semiconductor film 105b, and the oxide semiconductor film 105c can be minimized.

Note that the oxide semiconductor film 105a, the oxide semiconductor film 105b, and/or the oxide semiconductor film 105c can be formed using a deposition apparatus using ALD instead of a sputtering method. For example, in the case where an In—Ga—Zn oxide film is formed, an $In(CH_3)_3$ gas and an $O_3$ gas are sequentially introduced plural times to form an $InO_2$ layer, a $Ga(CH_3)_2$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_3H_5)_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Figure 14C:
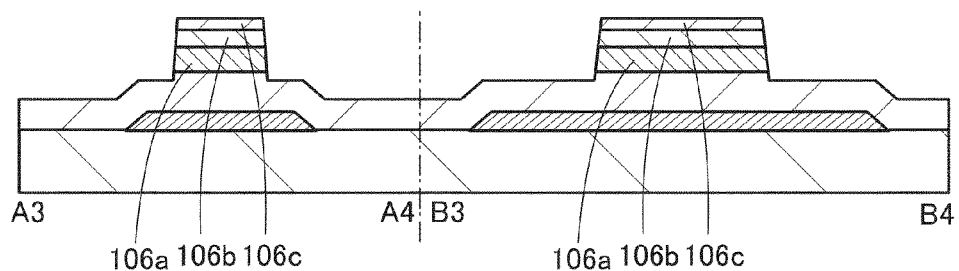

Next, a resist mask is formed using a photoresist mask over the oxide semiconductor film 105e through a photolithography process, and then the oxide semiconductor film 105c, the oxide semiconductor film 105b, and the oxide semiconductor film 105a are etched using the resist mask to be separated into each element, so that the oxide semiconductor layer 106a, the oxide semiconductor layer 106b, and the oxide semiconductor layer 106c are formed (see FIG. 14C). A wet etching method is preferably used for the etching. Note that a dr etching method may be used, or a combination of both methods may be used.

After the oxide semiconductor layer 106a, the oxide semiconductor layer 106b and the oxide semiconductor layer 106c are formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of each of the oxide semiconductor layers 106a, 106b and 106c and can reduce hydrogen, water, and the like contained in the oxide semiconductor layers 106a, 106b, and 106c. Note that the heat treatment for the purpose of reducing hydrogen, water, and the like may be performed before the oxide semiconductor layer 106a, the oxide semiconductor layer 106b, and the oxide semiconductor layer 106c are processed into an island shape. For example, the heat treatment may be performed in a period from deposition of the oxide semiconductor films 105a and 105b to deposition of the oxide semiconductor film 105c.

An electric furnace, an RTA apparatus, or the like can be used for the heat treatment performed on the oxide semiconductor layer 106a, the oxide semiconductor layer 106b, and the oxide semiconductor layer 106c. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor layer 106a, the oxide semiconductor layer 106b, and the oxide semiconductor layer 106c may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor layer and oxygen can be supplied to the oxide semiconductor layer at the same time. Consequently, the amount of oxygen vacancies in the oxide semiconductor layer can be reduced.

Figure 14D:
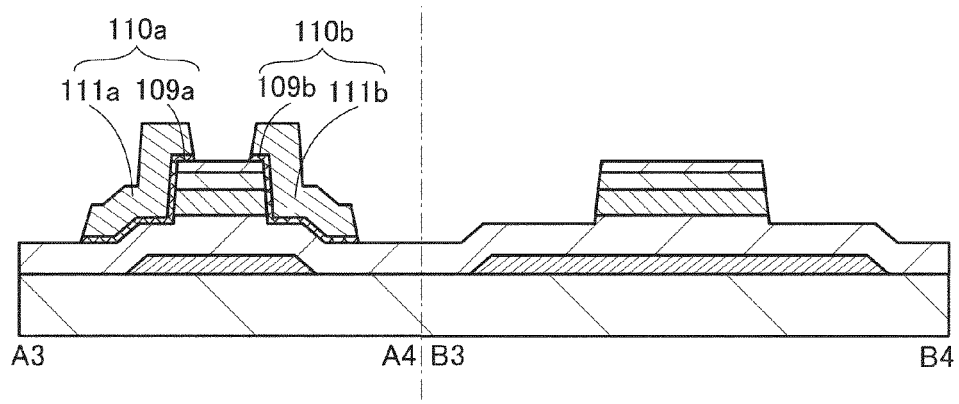

Next, the pair of electrodes (the electrodes 110a and 110b) is formed in contact with side surfaces of the oxide semiconductor layer 106a and the oxide semiconductor layer 106b, and top and side surfaces of the oxide semiconductor layer 106c (see FIG. 14D).

Here, a 50-nm-thick tungsten film to be the first conductive layer 109a and the first conductive layer 109b and a 300-nm-thick copper film to be the second conductive layer 111a and the second conductive layer 111b are formed by a sputtering method. Then, a resist mask is formed over the copper film through a photolithography process using a photoresist mask, and the tungsten film and the copper film are processed using the resist mask to be the pair of electrodes (the electrodes 110a and 110b). Note that as described above, the conductive films such as the tungsten film and the copper film may be formed by an ALD method or a thermal CVD method. Any of these methods makes it possible to form the conductive films without plasma damage to the oxide semiconductor layer 106a, the oxide semiconductor layer 106b, and the oxide semiconductor layer 106c.

For example, when a wet etching method is used for etching the copper film and a dry etching method using SF$_6$ is used for etching the tungsten film, a fluoride is formed on the surface of the copper film, and copper of the copper film can be prevented from diffusing to the oxide semiconductor layer 106a owing to the fluoride. In addition, the oxide semiconductor layer 106c can function as an etching protective film for the oxide semiconductor layer 106a.

Then, the oxide insulating layer 112 is formed over the pair of electrodes (the electrodes 110a and 110b). After that, the oxide insulating layer 114 is formed over the oxide insulating layer 112.

It is preferable to form the oxide insulating layer 114 without exposure to the atmosphere, directly after the oxide insulating layer 112 is formed. After the oxide insulating layer 112 is formed, the oxide insulating layer 114 is formed by adjusting at least one of the flow rate of a source gas, pressure, a high-frequency power, and a substrate temperature without exposure to the air, whereby the concentration of impurities attributed to the atmospheric component at the interface between the oxide insulating layer 112 and the oxide insulating layer 114 can be reduced and oxygen in the oxide insulating layer 114 can be moved to the oxide semiconductor layer 106a; accordingly, the amount of oxygen vacancy in the oxide semiconductor layer 106a can be reduced.

For example, a silicon oxide film or a silicon oxynitride film can be formed as the oxide insulating layer 112 under the following conditions: the substrate placed in an evacuated treatment chamber of the plasma CVD apparatus is held at a temperature ranging from 180° C., to 400° C., preferably from 200° C. to 370° C.; the pressure of the chamber into which the source gas is introduced is set in the range from 20 Pa to 250 Pa, preferably from 100 Pa to 250 Pa; and high-frequency power is supplied to the electrode provided in the treatment chamber.

With the use of the above deposition conditions, an oxide insulating layer which is permeable to oxygen can be formed as the oxide insulating layer 112. Further, by providing the oxide semiconductor layer 106c and the oxide insulating layer 112, damage to the oxide semiconductor layer 106a can be reduced in a step of forming the oxide insulating layer 114 which is formed later.

Under these deposition conditions, the bonding strength of silicon and oxygen becomes strong when the substrate temperature is higher than or equal to 300° C. and lower than or equal to 400° C., preferably higher than or equal to 320° C. and lower than or equal to 370° C. Thus, as the oxide insulating layer 112, a dense and hard oxide insulating layer that is permeable to oxygen, typically, a silicon oxide film or a silicon oxynitride film of which etching using hydrofluoric acid of 0.5 wt % at 25° C. is performed at a rate of lower than or equal to 10 nm/nm, preferably lower than or equal to 8 nm/min can be formed.

It is effective for release of hydrogen, water, and the like contained in the oxide semiconductor layer 106a, the oxide semiconductor layer 106b, and the oxide semiconductor layer 106c to form the oxide insulating layer 112 while heating is performed in the step of depositing the oxide insulating layer 112. Hydrogen contained in the oxide semiconductor layer 106a is bonded to an oxygen radical formed in plasma to form water. Since the substrate is heated in the step for depositing the oxide insulating layer 112, water formed by bonding of oxygen and hydrogen is released from the oxide semiconductor layer 106a. That is, formation of the oxide insulating layer 112 by a plasma CVD method can reduce the amount of water, hydrogen, and the like contained in the oxide semiconductor layer 106a.

Furthermore, by setting the pressure in the treatment chamber to be higher than or equal to 100 Pa and lower than or equal to 250 Pa, the amount of water contained in the oxide insulating layer 112 is reduced; thus, variation in electrical characteristics of the transistor 210 can be reduced and change in threshold voltage can be inhibited.

Note that it is preferable to reduce damage to the oxide semiconductor layer 106a as much as possible at the time of depositing the oxide insulating layer 112. This is because in the case where the oxide insulating layer 114 that is formed later for the purpose of improving the reliability of the transistor is formed under the conditions that can reduce the defects in the film, the amount of oxygen released from the oxide insulating layer 114 tends to be reduced, and thus it is difficult to adequately reduce defects of the oxide semiconductor layer 106a. Thus, it is preferable that the pressure in a treatment chamber be higher than or equal to 100 Pa and lower than or equal to 250 Pa at the time of depositing the oxide insulating layer 112. Deposition under such conditions can reduce damage to the oxide semiconductor layer 106a.

Note that when the ratio of the amount of the oxidizing gas to the amount of the deposition gas containing silicon is 100 or higher, the hydrogen content in the oxide insulating layer 112 can be reduced. Consequently, the amount of hydrogen entering the oxide semiconductor layer 106a can be reduced, thereby inhibiting the negative shift in the threshold voltage of the transistor.

As the oxide insulating layer 114, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to the electrode provided in the treatment chamber.

As the deposition conditions of the oxide insulating layer 114, the high-frequency power having the above power density is supplied to the reaction chamber having the above pressure, whereby the degradation efficiency of the source gas in plasma is increased, oxygen radicals are increased, and oxidation of the source gas is promoted; therefore, the oxygen content of the oxide insulating layer 114 becomes higher than that in the stoichiometric composition. On the other hand, in the film formed at a substrate temperature within the above temperature range, a bond between silicon and oxygen is weak, and accordingly, part of oxygen in the film is released by heat treatment in a later step. Thus, it is possible to form an oxide insulating layer which contains oxygen in a proportion higher than that of oxygen in the stoichiometric composition and from which part of oxygen is released by heating.

Note that the oxide insulating layer 112 serves as a protective film of the oxide semiconductor layer 106c in the step of forming the oxide insulating layer 114. Furthermore, the oxide semiconductor layer 106c serves as a protective film of the oxide semiconductor layer 106a. Consequently, the oxide insulating layer 114 can be formed using the high-frequency power having a high power density while damage to the oxide semiconductor layer 106a is reduced.

Note that in the deposition conditions of the oxide insulating layer 114, when the flow rate of the deposition gas containing silicon with respect to the oxidizing gas is increased, the amount of defects in the oxide insulating layer 114 can be reduced. Typically, it is possible to form an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1 \times 10^{17}$ spins/cm$^3$ by ESR measurement. As a result, the reliability of the transistor can be improved.

After oxide insulating layer 112 and the oxide insulating layer 114 are formed, heat treatment is performed. By the heat treatment, part of oxygen contained in the oxide insulating layer 114 can be moved to the oxide semiconductor layer 106a, so that the amount of oxygen vacancy contained in the oxide semiconductor layer 106a can be further reduced. After the heat treatment, the nitride insulating layer 116 is formed.

In the case where water, hydrogen, or the like is contained in the oxide insulating layer 112 and the oxide insulating layer 114, when the nitride insulating layer 116 having a function of blocking water, hydrogen, and the like is formed and then heat treatment is performed, water, hydrogen, or the like contained in the oxide insulating layer 112 and the oxide insulating layer 114 are moved to the oxide semiconductor layer 106a, so that defects are generated in the oxide semiconductor layer 106a. Thus, when heat treatment is performed before formation of the nitride insulating layer 116, water or hydrogen contained in the oxide insulating layer 112 and the oxide insulating layer 114 can be effectively reduced.

Note that when the oxide insulating layer 114 is formed over the oxide insulating layer 112 while being heated, oxygen can be moved to the oxide semiconductor layer 106a to reduce oxygen vacancy included in the oxide semiconductor layer 106a; therefore, the heat treatment is not necessarily performed in some cases.

The temperature of the heat treatment performed on the oxide insulating layer 112 and the oxide insulating layer 114 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

Here, the heat treatment is performed at 350° C. in a mixed atmosphere of nitrogen and oxygen for one hour. After that, the nitride insulating layer 116 is formed (see FIG. 15A).

In the case where the nitride insulating layer 116 is formed by a plasma CVD method, the substrate temperature is preferably higher than or equal to 300° C. and lower than or equal to 400° C., further preferably higher than or equal to 320° C. and lower than or equal to 370° C. because a dense film can be formed.

For example, in the case where a silicon nitride film is formed as the nitride insulating layer 116 by the plasma CVD method, a deposition gas containing silicon, nitrogen, and ammonia are preferably used as a source gas. A small amount of ammonia compared to the amount of nitrogen is used, whereby ammonia is dissociated in plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

Here, a 50-nm-thick silicon nitride film is formed as the nitride insulating layer 116 using source gases of silane, nitrogen, and ammonia with a plasma CVD apparatus. The flow rates of silane, nitrogen, and ammonia are 50 sccm, 5000 sccm, and 100 sccm, respectively. The pressure in a treatment chamber is set to 100 Pa, the substrate temperature is set to 350° C., and a high frequency power of 1000 W is supplied to parallel plate electrodes using a high frequency power source of 27.12 MHz. Note that a PECVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

After formation of the nitride insulating layer 116, heat treatment may be performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. When the heat treatment is performed, the amount of hydrogen and water of the oxide insulating layers 112 and 114 is reduced; therefore, generation of defects in the oxide semiconductor layer 106a described above is inhibited.

Next, a resist mask is formed over the nitride insulating layer 116 through a photolithography process using a photoresist mask. The nitride insulating layer 116, the oxide insulating layer 112 and the oxide insulating layer 114, and the gate insulating layer 104 are etched using the resist mask to form the opening portion 117a and the opening portion 117b (see FIG. 15B).

Figure 15A:
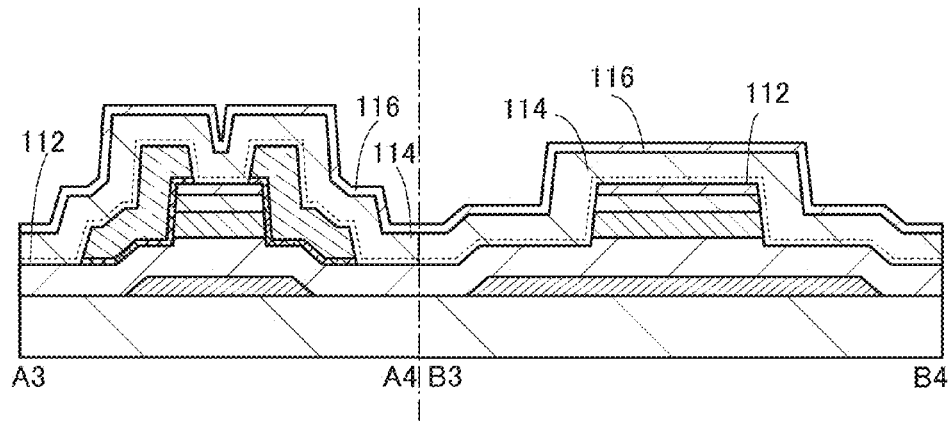
FIGS. 15A to 15C are cross-sectional views illustrating a manufacturing process of a transistor of one embodiment of the present invention.
Figure 15B:
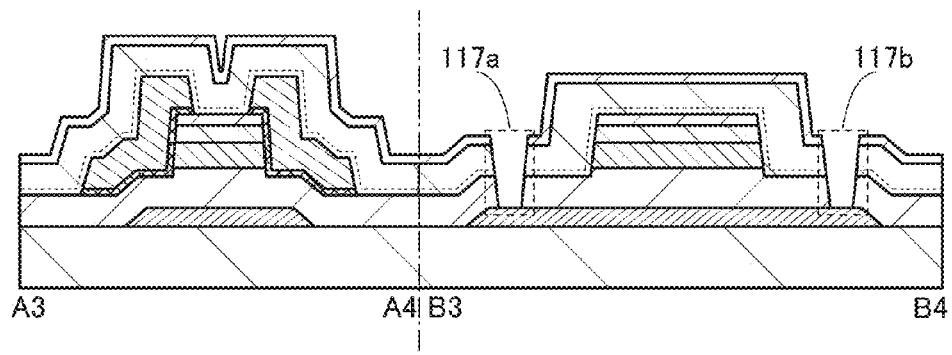
Figure 15C:
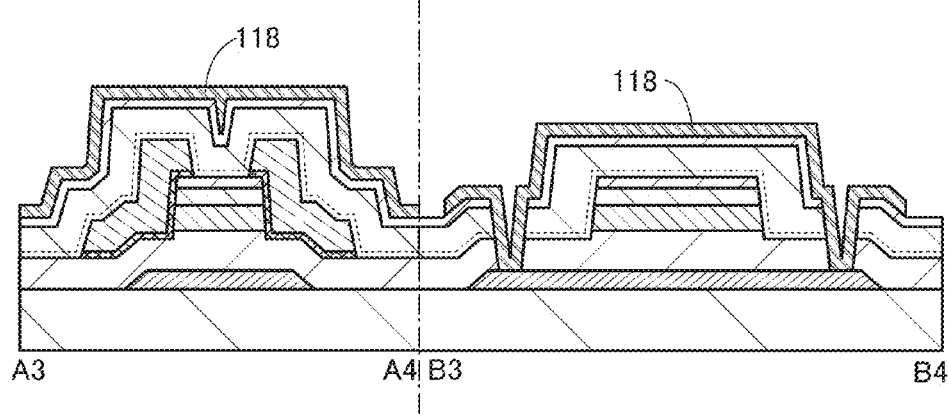

After the resist mask is removed, a conductive film is formed over the nitride insulating layer 116 and processed to form the electrode 118 functioning as a back gate electrode see FIG. 15C).

Through the above-described process, the transistor 210 of this embodiment can be formed. Note that the other transistors of this embodiment can be formed in a manner similar to that of the transistor 210.

As described above, since electrodes containing a low-resistance material such as copper, aluminum, gold, or silver are used as the pair of electrodes functioning as the source and drain electrodes in the transistor described in this embodiment, a semiconductor device in which wiring delay is suppressed can be manufactured. Furthermore, when an oxide semiconductor layer functioning as a barrier layer is provided in contact with the pair of electrodes, a reduction in the electrical characteristics can be inhibited, so that the semiconductor device can have favorable electrical characteristics.

According to the manufacturing process of this embodiment, it is possible to manufacture a highly reliable transistor in which the oxygen vacancy in the oxide semiconductor layer including the channel formation region is reduced and the impurity concentration is reduced.

Furthermore, since the transistor of this embodiment is a channel-etched transistor that is formed in such a manner that the oxide semiconductor layer 106c functioning as a barrier layer for preventing entry of impurities is formed using the same mask as the oxide semiconductor layer 106a, the number of masks can be reduced as compared to the case of a channel protective transistor. Therefore, the manufacturing cost of the semiconductor device can be reduced.

The structure and method described in this embodiment can be implemented by being combined as appropriate with any of the other structures and methods described in the other embodiments.

Embodiment 2

The structure of an oxide semiconductor layer included in a transistor of one embodiment of the present invention is described in this embodiment.

Structure of Oxide Semiconductor Layer>

A structure of an oxide semiconductor layer s described below.

An oxide semiconductor layer is classified into a single crystal oxide semiconductor layer and a non-single-crystal oxide semiconductor layer. Examples of a non-single-crystal oxide semiconductor layer include a c-axis aligned crystalline oxide semiconductor (CAAC-OS) layer, a polycrystalline oxide semiconductor layer, a microcrystalline oxide semiconductor layer, and an amorphous oxide semiconductor layer.

From another perspective, an oxide semiconductor layer is classified into an amorphous oxide semiconductor layer and a crystalline oxide semiconductor layer. Examples of a crystalline oxide semiconductor layer include a single crystal oxide semiconductor layer, a CAAC-OS layer, a polycrystalline oxide semiconductor layer, and a microcrystalline oxide semiconductor layer.

<CAAC-OS Layer>

First, a CAAC-OS layer is described. Note that a CAAC-OS layer can be referred to as an oxide semiconductor layer including c-axis aligned nanocrystals (CANC).

A CAAC-OS layer is one of oxide semiconductor layers having a plurality of c-axis aligned crystal parts (also referred to as pellets).

In a combined analysis image (also referred to as a high-resolution TEM image) of a bright-field image and a diffraction pattern of a CAAC-OS layer, which is obtained using a transmission electron microscope (TEM), a plurality of pellets can be observed. However, in the high-resolution TEM image, a boundary between pellets, that is, a grain boundary is not clearly observed. Thus, in the CAAC-OS layer, a reduction in electron mobility due to the grain boundary is less likely to occur.

Figure 16A:
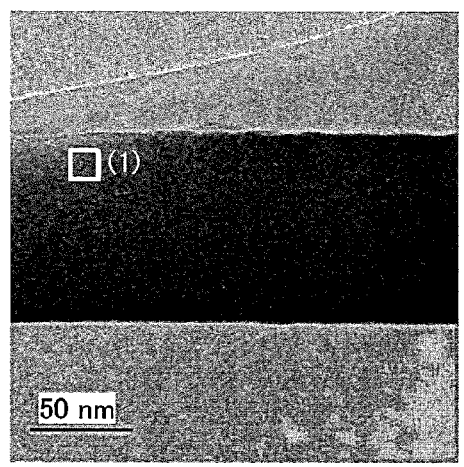
FIGS. 16A to 16D are Cs-corrected high-resolution TEM images of a cross section of a CAAC-OS and a cross-sectional schematic view of the CAAC-OS.

A CAAC-OS layer observed with TEM is described below. FIG. 16A shows a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 16B:
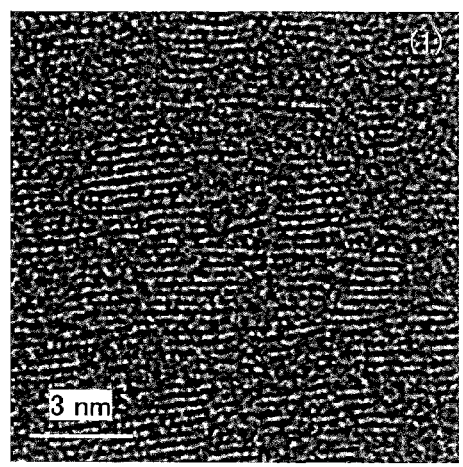

FIG. 16B is an enlarged Cs-corrected high-resolution TEM image of a region (1) in FIG. 16A. FIG. 16B shows that metal atoms are arranged in a layered manner in a pellet. Each metal atom layer has a configuration reflecting unevenness of a surface over which the CAAC-OS layer is formed (hereinafter, the surface is referred to as a formation surface) or a top surface of the CAAC-OS layer, and is arranged parallel to the formation surface or the top surface of the CAAC-OS layer.

Figure 16C:
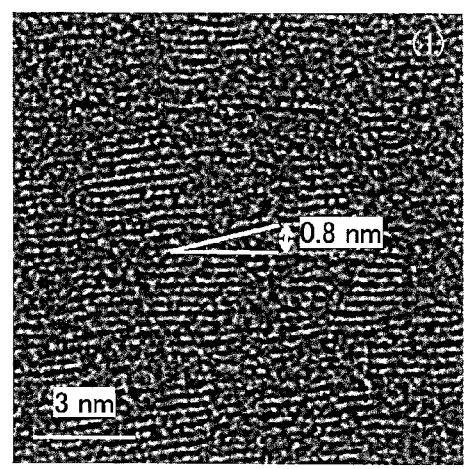

As shown in FIG. 16B, the CAAC-OS layer has a characteristic atomic arrangement. The characteristic atomic arrangement is denoted by an auxiliary line in FIG. 16C. FIGS. 16B and 16C prove that the size of a pellet is approximately 1 nm to 3 nm, and the size of a space caused by tilt of the pellets is approximately 0.8 nm. Therefore, the pellet can also be referred to as a nanocrystal (nc).

Figure 16D:
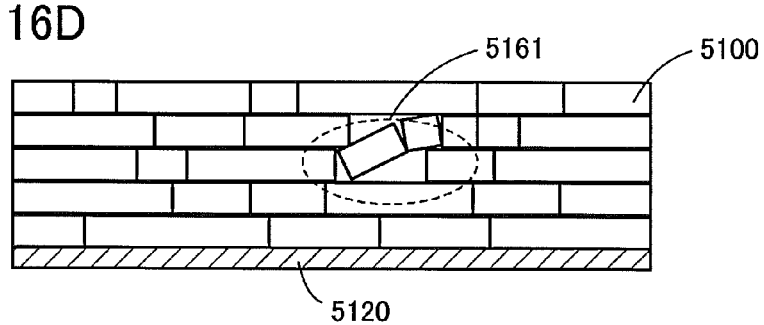

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 16D). The part in which the pellets are tilted as observed in FIG. 16C corresponds to a region 5161 shown in FIG. 16D.

FIG. 17A shows a Cs-corrected high-resolution TEM image of a plane of the CAAC-OS layer observed from a direction substantially perpendicular to the sample surface. FIGS. 17B, 17C, and 17D are enlarged Cs-corrected high-resolution TEM images of regions (1), (2), and (3) in FIG. 17A, respectively. FIGS. 17B, 17C, and 17D indicate that metal atoms are arranged in a triangular, quadrangular, or hexagonal configuration in a pellet. However, there is no regularity of arrangement of metal atoms between different pellets.

Figure 18A:
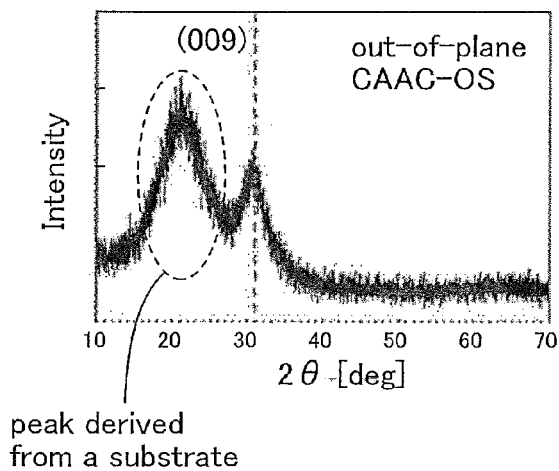
FIGS. 18A to 18C show structural analysis of a CAAC-OS and a single crystal oxide semiconductor by XRD.

Next, a CAAC-OS layer analyzed by X-ray diffraction (XRD) is described. For example, when the structure of a CAAC-OS layer including an $InGaZnO_4$ crystal is analyzed by an out-of-plane method, a peak appears at a diffraction angle (2θ) of around 31° as shown in FIG. 18A. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

Note that in structural analysis of the CAAC-OS layer by an out-of-plane method, another peak may appear when 2θ is around 36°, in addition to the peak at 2θ of around 31°. The peak at 2θ of around 36° indicates that a crystal having no c-axis alignment is included in part of the CAAC-OS layer. It is preferable that in the CAAC-OS layer analyzed by an out-of-plane method, a peak appear when 2θ is around 31° and that a peak not appear when 2θ is around 36°.

Figure 18B:
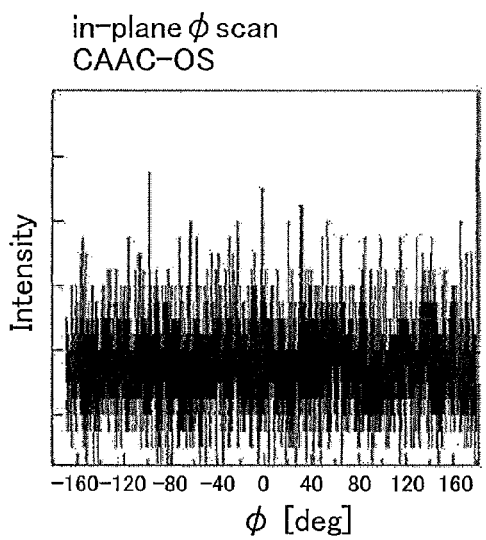
Figure 18C:
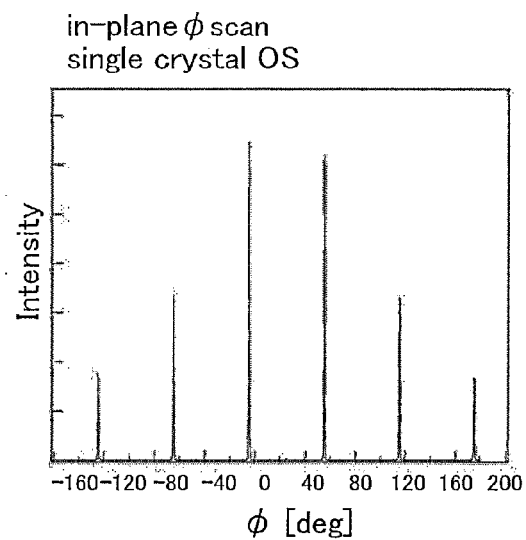

On the other hand in structural analysis of the CAAC-OS layer by an in-plane method in which an X-ray is incident on a sample in a direction substantially perpendicular to the c-axis a peak appears when 2θ is around 56°. This peak is attributed to the (110) plane of the $InGaZnO_4$ crystal. In the case of the CAAC-OS layer, when analysis (φ scan) is performed with 2θ fixed at around 56° and with the sample rotated using a normal vector of the sample surface as an axis (φ axis), as shown in FIG. 18B, a peak is not clearly observed. In contrast, in the case of a single crystal oxide semiconductor layer of $InGaZnO_4$, when φ scan is performed with 2θ fixed at around 56°, as shown in FIG. 18C, six peaks which are derived from crystal planes equivalent to the (110) plane are observed. Accordingly, the structural analysis using XRD shows that the directions of a-axes and b-axes are different in the CAAC-OS layer.

Figure 19A:
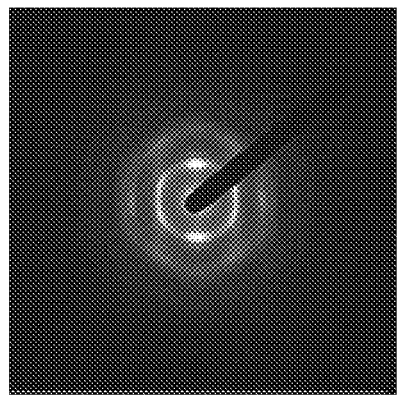
FIGS. 19A and 19B show electron diffraction patterns of a CAAC-OS.
Figure 19B:
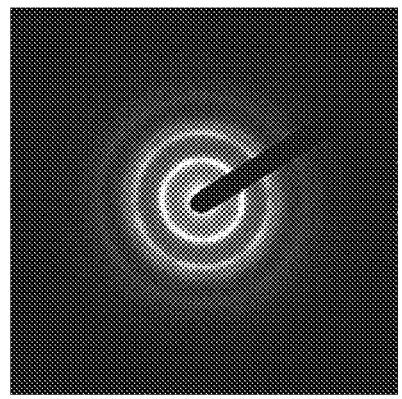

Next, a CAAC-OS layer analyzed by electron diffraction is described. For example, when an electron beam with a probe diameter of 300 nm is incident on a CAAC-OS layer including an $InGaZnO_4$ crystal in a direction parallel to the sample surface, a diffraction pattern (also referred to as a selected-area transmission electron diffraction pattern) shown in FIG. 19A might be obtained. In this diffraction pattern, spots derived from the (009) plane of an $InGaZnO_4$ crystal are included. Thus, the electron diffraction also indicates that pellets included in the CAAC-OS layer have c-axis alignment and that the c-axes are aligned in a direction substantially perpendicular to the formation surface or the top surface of the CAAC-OS layer. Meanwhile, FIG. 19B shows a diffraction pattern obtained in such a manner that an electron beam with a probe diameter of 300 nm is incident on the same sample in a direction perpendicular to the sample surface. As shown in FIG. 19B, a ring-like diffraction pattern is observed. Thus, the electron diffraction also indicates that the a-axes and b-axes of the pellets included in the CAAC-OS layer do not have regular alignment. The first ring in FIG. 19B is considered to be derived from the (010) plane, the (100) plane, and the like of the $InGaZnO_4$ crystal. The second ring in FIG. 191B is considered to be derived from the (110) plane and the like.

Moreover, the CAAC-OS layer is an oxide semiconductor layer having a low density of defect states. Defects in the oxide semiconductor layer are, for example, a defect due to impurity and oxygen vacancy. Therefore, the CAAC-OS layer can be regarded as an oxide semiconductor layer with a low impurity concentration, or an oxide semiconductor layer having a small amount of oxygen vacancy.

The impurity contained in the oxide semiconductor layer might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor layer, such as hydrogen, carbon, silicon, or a transition metal element. For example, an element (specifically, silicon or the like) having higher strength of bonding to oxygen than a metal element included in an oxide semiconductor layer extracts oxygen from the oxide semiconductor layer, which results in disorder of the atomic arrangement and reduced crystallinity of the oxide semiconductor layer. A heavy metal such as iron or nickel, argon, carbon dioxide, or the like has a large atomic radius (or molecular radius), and thus disturbs the atomic arrangement of the oxide semiconductor layer and decreases crystallinity.

An oxide semiconductor layer having a low density of defect states (a small amount of oxygen vacancy) can have a low cattier density. Such an oxide semiconductor layer is referred to as a highly purified intrinsic or substantially highly purified intrinsic oxide semiconductor layer. A CAAC-OS layer has a low impurity concentration and a low density of defect states. That is, a CAAC-OS layer is likely to be highly purified intrinsic or substantially highly purified intrinsic oxide semiconductor layer. Thus, a transistor including a CAAC-OS layer rarely has negative threshold voltage (is rarely normally on). The highly purified intrinsic or substantially highly purified intrinsic oxide semiconductor layer has few carrier traps. An electric charge trapped by the carrier traps in the oxide semiconductor layer takes a long time to be released. The trapped electric charge may behave like a fixed electric charge. Thus, the transistor which includes the oxide semiconductor layer having a high impurity concentration and a high density of defect states might have unstable electrical characteristics. However, a transistor including a CAAC-OS layer has small variation in electrical characteristics and high reliability.

Since the CAAC-OS layer has a low density of defect states, carries generated by light irradiation or the like are less likely to be trapped in defect states. Therefore, in a transistor using the CAAC-OS layer, change in electrical characteristics due to irradiation with visible light or ultraviolet light is small.

<Microcrystalline Oxide Semiconductor Layer>

Next, a microcrystalline oxide semiconductor layer is described.

A microcrystalline oxide semiconductor layer has a region in which a crystal part is observed and a region in which a crystal part is not clearly observed in a high-resolution TEM image. In most cases, the size of a crystal part included in the microcrystalline oxide semiconductor layer is greater than or equal to 1 nm and less than or equal to 100 nm, or greater than or equal to 1 nm and less than or equal to 10 nm. An oxide semiconductor layer including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) layer. In a high-resolution TEM image of the nc-OS, for example, a grain boundary is not clearly observed in some cases. Note that there is a possibility that the origin of the nanocrystal is the same as that of a pellet in a CAAC-OS layer. Therefore, a crystal part of the nc-OS layer may be referred to as a pellet in the Mowing description.

In the nc-OS layer, a microscopic region (for example, a region with a size greater than or equal to 1 nm and less than or equal to 10 nm, in particular, a region with a size greater than or equal to 1 nm and less than or equal to 3 nm has a periodic atomic arrangement. There is no regularity of crystal orientation between different pellets in the nc-OS layer. Thus, the orientation of the whole film is not ordered. Accordingly, the nc-OS layer cannot be distinguished from an amorphous oxide semiconductor layer, depending on an analysis method. For example, when the nc-OS layer is subjected to structural analysis by an out-of-plane method with an XIII) apparatus using an X-ray having a diameter larger than the size of a pellet, a peak which shows a crystal plane does not appear. Furthermore, a diffraction pattern like a halo pattern is observed when the nc-OS layer is subjected to electron diffraction using an electron beam with a probe diameter (e.g., 50 nm or larger) that is larger than the size of a pellet (the electron diffraction is also referred to as selected-area electron diffraction). Meanwhile, spots appear in a natiobeam electron diffraction pattern of the nc-OS layer when an electron beam having a probe diameter close to or smaller than the size of a pellet is applied. Moreover, in a nanobeam electron diffraction pattern of the nc-OS layer, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS layer can also be referred to as an oxide semiconductor layer including random aligned nanocrystals (RANC) or an oxide semiconductor layer including non-aligned nanocrystals (NANC).

The nc-OS layer is an oxide semiconductor layer that has high regularity as compared with an amorphous oxide semiconductor layer. Therefore, the nc-OS layer is likely to have a lower density of defect states than an amorphous oxide semiconductor layer. Note that there is no regularity of crystal orientation between different pellets in the nc-OS layer. Therefore, the nc-OS layer has a higher density of defect states than the CAAC-OS layer.

<Amorphous Oxide Semiconductor Layer>

Next, an amorphous oxide semiconductor layer is described.

The amorphous oxide semiconductor layer is an oxide semiconductor layer having disordered atomic arrangement and no crystal part and exemplified by an oxide semiconductor layer which exists in an amorphous state as quartz.

In a high-resolution TEM image of the amorphous oxide semiconductor layer, crystal parts cannot be found.

When the amorphous oxide semiconductor layer is subjected to structural analysis by an out-of-plane method with an XRD apparatus, a peak which shows a crystal plane does not appear. A halo pattern is observed when the amorphous oxide semiconductor layer is subjected to electron diffraction. Furthermore, a spot is not observed and only a halo pattern appears when the amorphous oxide semiconductor layer is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS layer and an nc-OS layer cannot be called an amorphous oxide semiconductor layer or a completely amorphous oxide semiconductor layer.

<Amorphous-Like Oxide Semiconductor Layer>

Note that an oxide semiconductor layer may have a structure inter nediate between the nc-OS layer and the amorphous oxide semiconductor layer. The oxide semiconductor layer having such a structure is specifically referred to as an amorphous-like oxide semiconductor (a-like OS) layer.

In a high-resolution TEM image of the a like OS layer, a void may be observed. Furthermore, in the high-resolution TEM image, there are a region where a crystal part is clearly observed and a region where a crystal part is not observed.

The a-like OS layer has an unstable structure because it includes a void. To verily that an a-like OS layer has an unstable structure as compared with a CAAC-OS layer and an nc-OS layer, a change in structure caused by electron irradiation is described below.

An a-like OS layer, an nc-OS layer, and a CAAC-OS layer are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 20:
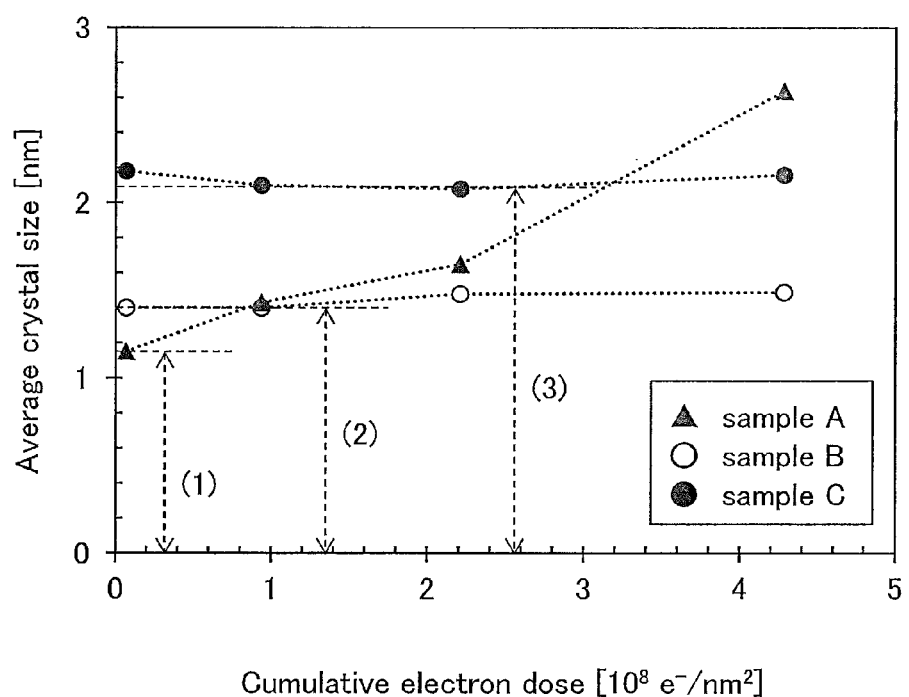
FIG. 20 shows a change of crystal parts of an In—Ga—Zn oxide owing to electron irradiation.

FIG. 20 shows change in the average size of crystal parts (at 22 points to 45 points) in each sample. Note that the crystal part size corresponds to the length of a lattice fringe. FIG. 20 indicates that the crystal part size in the a-like OS layer increases with an increase in the cumulative electron dose. Specifically, as shown by (1) in FIG. 20, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$, in contrast, the crystal part size in the nc-OS layer and the CAAC-OS layer shows little change from the start of electron irradiation to a cumulative electron dose of $4.2 \times 10^8$ $e^-/nm^2$. Specifically, as shown by (2) and (3) in FIG. 20, the average crystal sizes in an nc-OS layer and a CAAC-OS layer are approximately 1.4 nm and approximately 2.1 nm, respectively, regardless of the cumulative electron dose.

In this manner, growth of the crystal part in the a-like OS layer is induced by electron irradiation. In contrast, in the nc-OS layer and the CAAC-OS layer, growth of the crystal part is hardly induced by electron irradiation. Therefore, the a-like OS layer has an unstable structure as compared with the nc-OS layer and the CAAC-OS layer.

The a-like OS layer has a lower density than the nc-OS layer and the CAAC-OS layer because it includes a void. Specifically, the density of the a-like OS layer is higher than or equal to 78.6% and lower than 92.3% of the density of the single crystal oxide semiconductor layer having the same composition. The density of each of the nc-OS layer and the CAAC-OS layer is higher than or equal to 92.3% and lower than 100% of the density of the single crystal oxide semiconductor layer having the same composition. Note that it is difficult to deposit an oxide semiconductor layer having a density of lower than 78% of the density of the single crystal oxide semiconductor layer.

For example, in the case of an oxide semiconductor layer having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS layer is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS layer and the CAAC-OS layer is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductor layers have various structures and various properties. Note that an oxide semiconductor layer may be a stacked layer including two or more films of an amorphous oxide semiconductor layer, an a-like OS layer, a microcrystalline oxide semiconductor layer, and a CAAC-OS layer, for example.

<Deposition Model>

Examples of deposition models of a CAAC-OS layer and an nc-OS layer are described below.

Figure 21A:
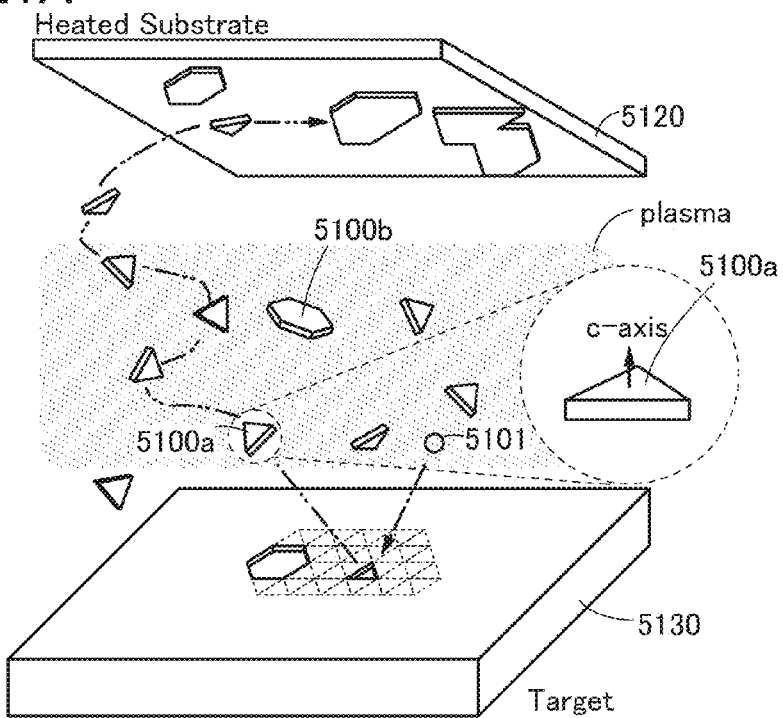
FIGS. 21A and 21B are schematic diagrams illustrating deposition models of a CAAC-OS and an nc-OS.

FIG. 21A is a schematic view of the inside of a deposition chamber where a CAAC-OS layer is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 22A:
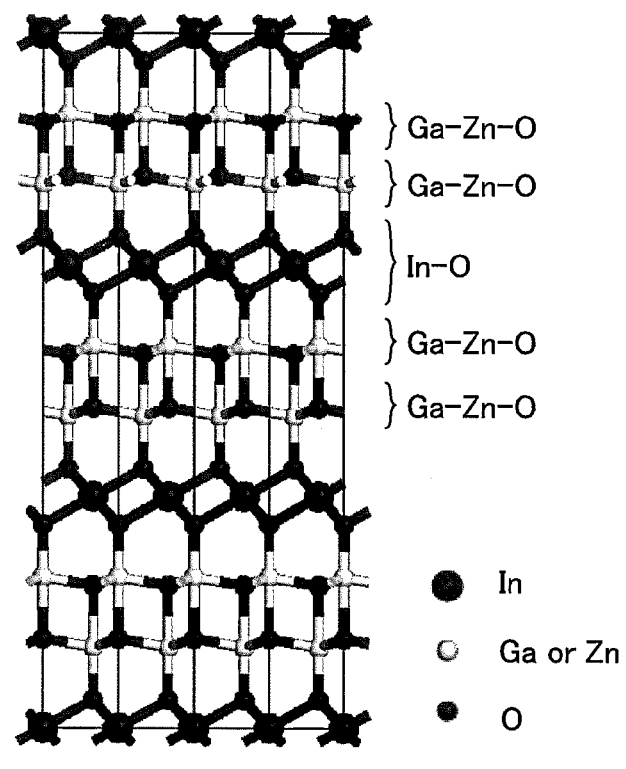
FIGS. 22A to 22C show an $InGaZnO_4$ crystal and a pellet.

Here, the target 5130 has a polycrystalline structure which includes a plurality of crystal grains and in which a cleavage plane exists in at least one crystal grain. FIG. 22A shows a structure of an $InGaZnO_4$ crystal included in the target 5130 as an example. Note that FIG. 22A shows a structure of the case where the $InGaZnO_4$ crystal is observed from a direction parallel to the b-axis. FIG. 22A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 22B:
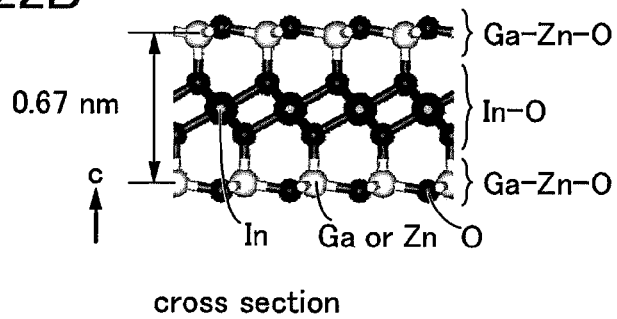
Figure 22C:
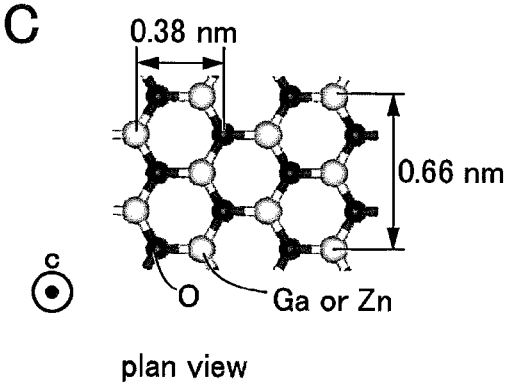

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 20. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 22B is separated. Note that FIG. 22C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS layer is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 2C) corresponds to the amount of growth in plasma. Here, in the case where the temperature of the substrate 5120 is at around room temperature, the pellet 5100 on the substrate 5120 hardly grows; thus, an nc-OS layer is formed (see FIG. 21B). An nc-OS layer can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 21B:
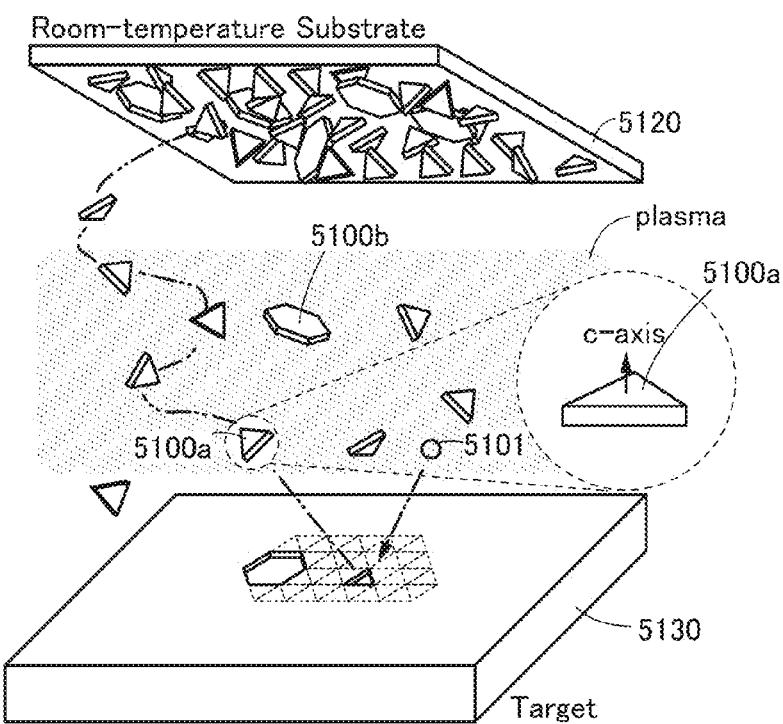

As shown in FIGS. 21A and 21B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force ma be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 21A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS layer might be filled; thus, the CAAC-OS layer has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS layer.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS layer does not have a structure like a board of a single crystal oxide semiconductor layer but has arrangement with a group of pellets 5100 (nanocrystals) like stacked bricks or blocks. Furthermore, a grain boundary does not exist between the pellets 5100. Therefore, even when deformation such as shrink occurs in the CAAC-OS layer owing to heating during deposition, heating or bending after deposition, it is possible to relieve local stress or release distortion. Therefore, this structure is suitable for a flexible semiconductor device. Note that the nc-OS layer has arrangement in which pellets 5100 (nanocrystals) are randomly stacked.

Figure 23A:
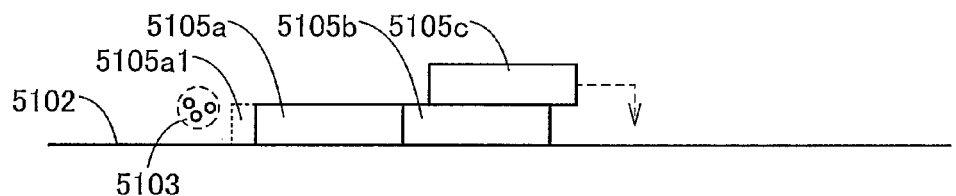
FIGS. 23A to 23D are schematic views showing a deposition model of a CAAC-OS.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm, FIGS. 23A to 23D are cross-sectional schematic views As illustrated in FIG. 23A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 23B:
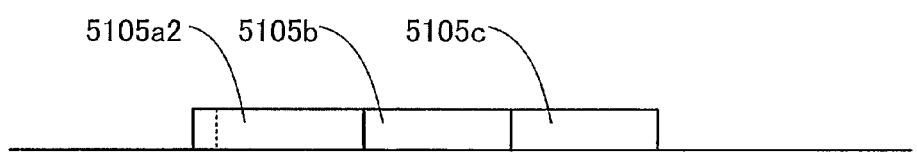

Then, as illustrated in FIG. 23B, the region 5105a1 grows to part of the pellet 5105a to form a pellet 5105a2, in addition, a side surface of the pellet 5105c is in contact with another side surface of the pellet 5105b.

Figure 23C:
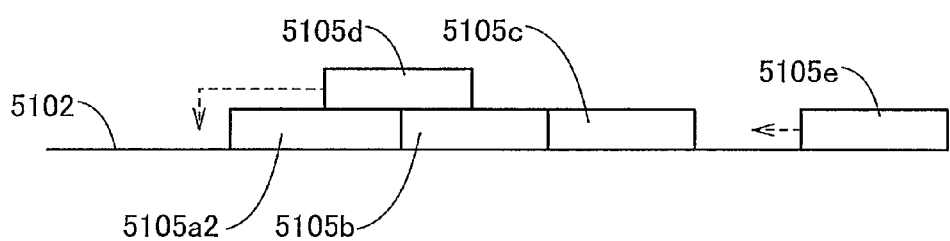

Next, as illustrated in FIG. 23C, a pellet 5105d is deposited over the pellet 5105a2 and the pellet 5105b, and then glides over the pellet 5105a2 and the pellet 5105b. Furthermore, a pellet 5105c glides toward another side surface of the pellet 5105c over the zinc oxide layer 5102.

Figure 23D:
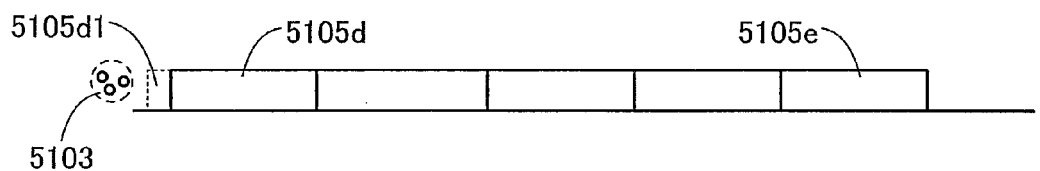

Then, as illustrated in FIG. 23D, the pellet 5105d is placed so that a side surface of the pellet 5105d is in contact with a side surface of the pellet 5105a2. Furthermore, a side surface of the pellet 5105c is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then crystal growth is caused at side surfaces of the pellets, whereby a CAAC-OS layer is formed over the substrate 5120. Therefore, each pellet of the CAAC-OS layer is larger than that of the nc-OS layer. A difference in size between (1) and (2) in FIG. 20 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor layer used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS layer can be deposited even when a formation surface does not have a crystal structure; therefore, a growth mechanism in this case is different from epitaxial growth. In addition, laser crystallization is not needed for formation of a CAAC-OS layer, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS layer can be formed.

In addition, it is found that in formation of the CAAC-OS layer, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS layer in which n layers (n is a natural number) in each of which the pellets 5100 are arranged along the unevenness are stacked is formed. Since the substrate 5120 has unevenness, a space is easily generated between the pellets 5100 in the CAAC-OS layer in some cases. Note that, even in such a case, owing to intermolecular force, the pellets 5100 are arranged so that a space between the pellets is as small as possible even on the unevenness surface. Therefore, even when the formation surface has unevenness, a CAAC-OS layer with high crystallinity can be obtained.

Since a CAAC-OS layer is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS layer with high crystallinity can be formed even on a formation surface with an amorphous structure.

The structure and method described in this embodiment can be implemented by being combined as appropriate with any of the other structures and methods described in the other embodiments.

Embodiment 3

In this embodiment, a structural example of a display panel as a semiconductor device of one embodiment of the present invention is described.

<Display Panel>

A display panel including a semiconductor device such as any of the above-described transistors is described below.

Figure 24A:
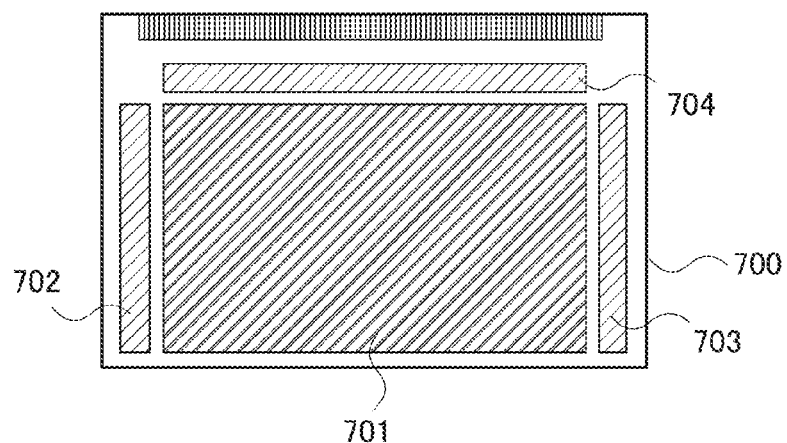
FIGS. 24A to 24C are a block diagram and circuit diagrams illustrating a configuration of a display device of one embodiment of the present invention.
Figure 24B:
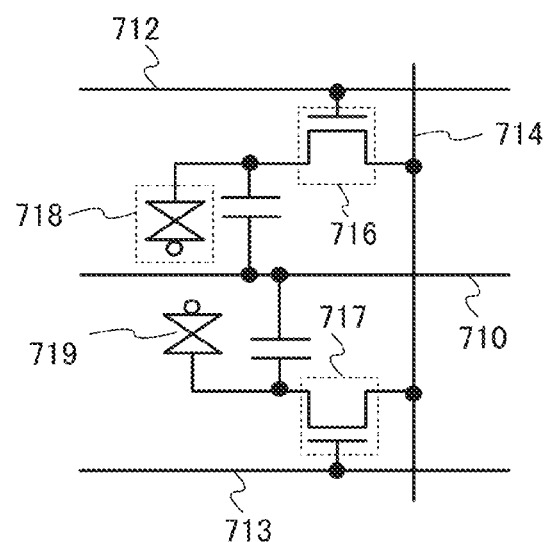
Figure 24C:
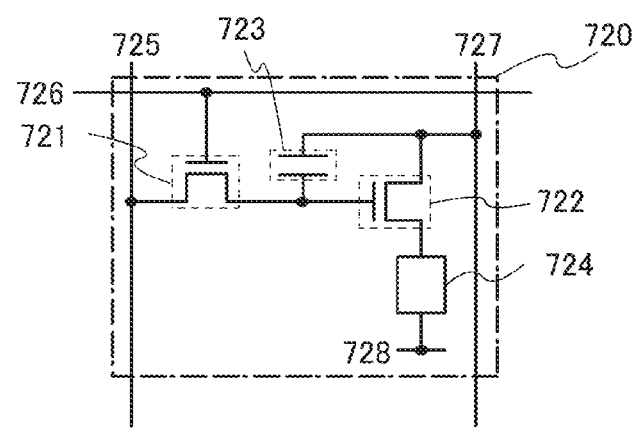

FIG. 24A is a top view of the display panel of one embodiment of the present invention. FIG. 24B is a circuit diagram illustrating a pixel circuit that can be used in the case where a liquid crystal element is used in a pixel in the display panel of one embodiment of the present invention. FIG. 24C is a circuit diagram illustrating a pixel circuit that can be used in the case where an organic EL element is used in a pixel in the display panel of one embodiment of the present invention.

As the transistor to be disposed in the pixel portion, the transistor described in Embodiment 1 can be used. Furthermore, the transistor can easily be an n-channel transistor, and thus, part of a driver circuit that can be formed using an n-channel transistor in the driver circuit is formed over the same substrate as the transistor of the pixel portion. With the use of the transistor described in Embodiment 1 for the pixel portion or the driver circuit in this manner, a highly reliable display device can be provided.

FIG. 24A is an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels each including a display element are provided in matrix in respective regions in each of which the scan line and the signal line intersect with each other. The substrate 700 of the display device is connected to a timing control circuit (also referred to as a controller or a controller IC) through a connection portion such as a flexible printed circuit (FPC).

In FIG. 24A, the first scan line driver circuit 702, the second scan line driver circuit 703, and the signal line driver circuit 704 are formed over the same substrate 700 as the pixel portion 701. Accordingly, the number of components that are provided outside, such as a driver circuit, can be reduced, so that a reduction in cost can be achieved. Furthermore, if the driver circuit is provided outside the substrate 700, wirings would need to be extended and the number of connections of wirings would be increased, but by providing the driver circuit over the substrate 700, the number of connections of the wirings can be reduced. Consequently, an improvement in reliability or yield can be achieved.

[Liquid Crystal Panel]

FIG. 24B illustrates an example of a circuit configuration of a pixel in a liquid crystal panel as one mode of the display panel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in Embodiment 1 can be used as appropriate as each of the transistors 716 and 717. In the above manner, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of one embodiment of the present invention is not limited to that shown in FIG. 24B. For example, a switch, a resistor, a capacitor, a transistor, a sensor, or a logic circuit may be added to the pixel illustrated in FIG. 24B.

[Organic EL Panel]

As another mode of the display panel, an example of a circuit configuration of a pixel of an organic EL panel is shown in FIG. 24C.

In an organic EL element, by application of voltage to a light-emitting element, electrons are injected from one of a pair of electrodes and holes are injected from the other of the pair of electrodes, into a layer containing a light-emitting organic compound; thus, current flows. Then, recombination of the electrons and holes makes the light-emitting organic compound to form an excited state and to emit light when it returns from the excited state to a ground state. Based on such a mechanism, such a light-emitting element is referred to as a current-excitation type light-emitting element.

FIG. 24C illustrates an applicable example of a pixel circuit. In this example, one pixel includes two n-channel transistors. Note that the metal oxide film of one embodiment of the present invention can be used for channel formation regions of the n-channel transistors. Furthermore, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in Embodiment 1 can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order that the driver transistor 722 is operated in a linear region, voltage higher than the voltage of the power supply line 727 is applied to the gate electrode of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode of the driver transistor 722. A video signal by which the driver transistor 722 is operated in a saturation region is input, so that current is supplied to the light-emitting element 724, in order that the driver transistor 722 is operated in a saturation region, the potential of the power supply line 727 is set higher than the gate potential of the driver transistor 722. When an analog video signal is used, it is possible to supply current to the light-emitting element 724 in accordance with the video signal and perform analog grayscaie driving.

Note that the configuration of the pixel circuit is not limited to that shown in FIG. 24G. For example, a switch, a resistor, a capacitor, a sensor, a transistor, a logic circuit, or the like may be added to the pixel circuit illustrated in FIG. 24C.

In the case where the transistor described in Embodiment 1 is used for the circuit shown in FIGS. 24A to 24C, the source electrode is electrically connected to the low potential side and the drain electrode is electrically connected to the high potential side.

For example, in this specification and the like, a display element, a display device, which is a device including a display element, a light-emitting element, and a light-emitting device, which is a device including a light-emitting element, can employ various modes or can include various elements. Examples of a display element, a display device, a light-emitting element, or a light-emitting device include a display medium whose contrast, luminance, reflectance, transmittance, or the like is changed by electromagnetic action, such as an electrolurninescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), interferometric modulator display (IMOD) element, an electrowetting element, a piezoelectric ceramic display, or a carbon nanotube. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

This embodiment can be combined with any of the other embodiments disclosed in this specification as appropriate.

Embodiment 4

In this embodiment, a display module and electronic appliances that can be formed using a semiconductor device of one embodiment of the present invention are described.

Figure 25:
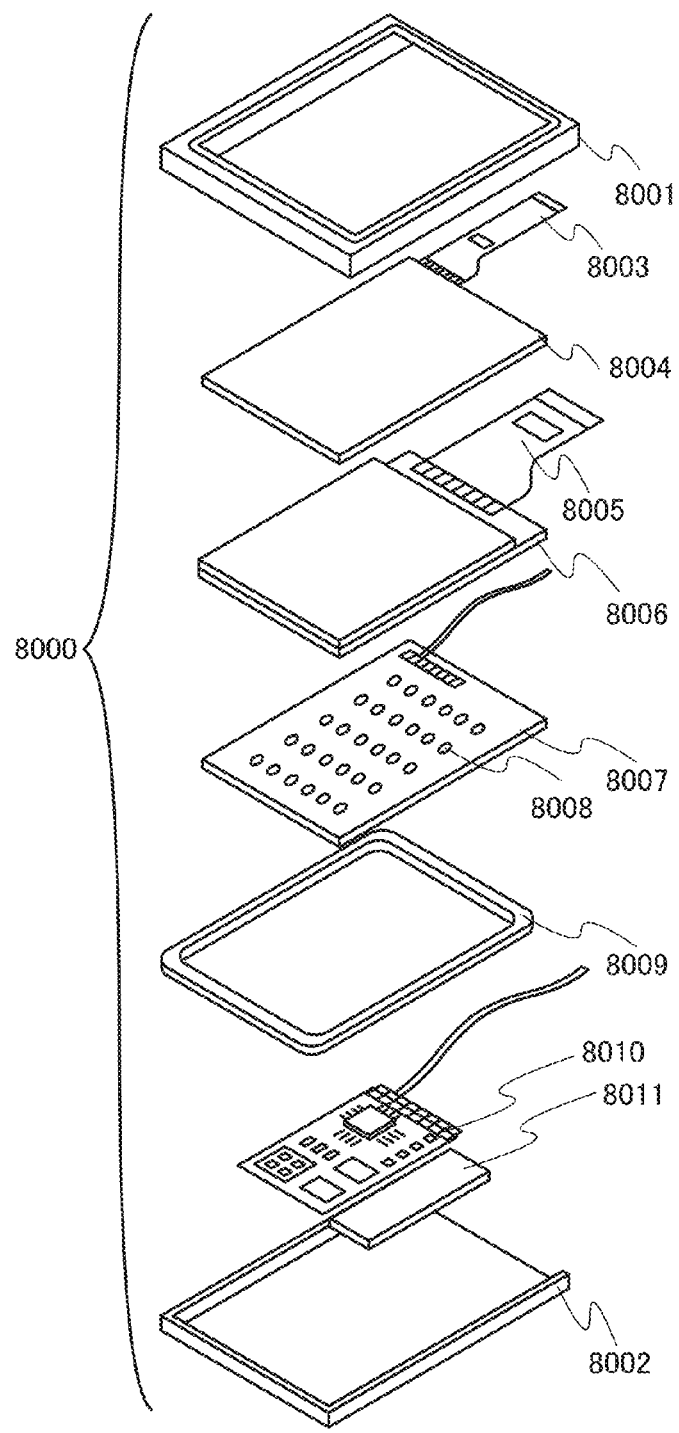
FIG. 25 illustrates a display module of one embodiment of the present invention.

In a display module 8000 illustrated in FIG. 25, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention carr be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be used overlapping with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed board 8010. The frame 8009 can function as a radiator plate.

The printed board 8010 is provided with power supply circuit and a signal processing circuit for outputting a video signal and a, clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 26A to 26D are external views of electronic appliances each including the semiconductor device of one embodiment of the present invention.

Examples of electronic appliances are a television set (also referred to as a television or a television receive monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 26A:
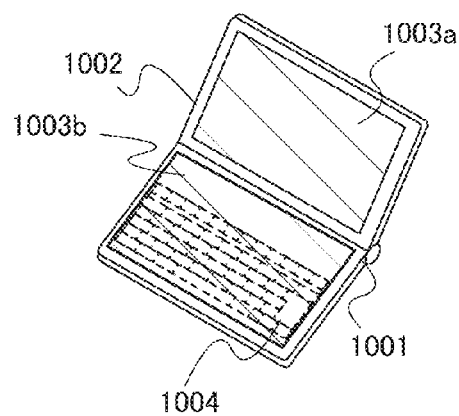
FIGS. 26A to 26D illustrate electronic appliances of one of embodiment of the present invention.

FIG. 26A illustrates a portable information terminal including a main body 1001, a housing 1002, a display portion 1003a, a display portion 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby a highly reliable portable information terminal can be provided.

The portable information terminal illustrated in FIG. 26A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (an earphone terminal, a USE terminal, or the like), a recording medium insertion portion, and the like may be provided on the back surface or the side surface of the housing.

The portable information terminal illustrated in FIG. 26A may transmit and receive data wirelessly. Through wireless communication, desired book data or the like can be purchased and downloaded from an e-book server.

Figure 26B:
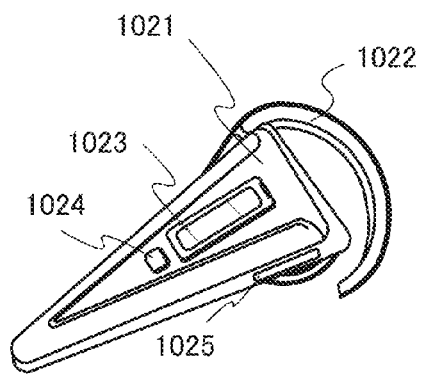

FIG. 26B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 26B has an antenna, a microphone function, or a wireless communication function and is used with a mobile phone, a user can talk on the phone wirelessly in a hands-free way while driving a car or the like.

Figure 26C:
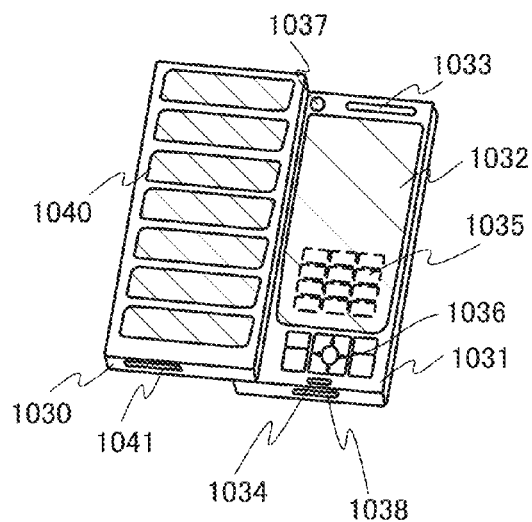

FIG. 26C illustrates a mobile phone including two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 which are displayed as images are indicated by dotted lines in FIG. 26C. Note that a boosting circuit by which a voltage output from the solar cell 1040 is increased to be sufficiently high for each circuit is also included.

In the display panel 1032, the direction of display is changed as appropriate depending on the application mode. Furthermore, the mobile phone is provided with the camera 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 26C can shift, by sliding, to a state where one overlaps with the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. In addition, by inserting a recording medium into the external memory slot 1041, a larger amount of data can be stored and moved.

In addition to the above functions, an infrared communication function, a television reception function, or the like may be provided.

Figure 26D:
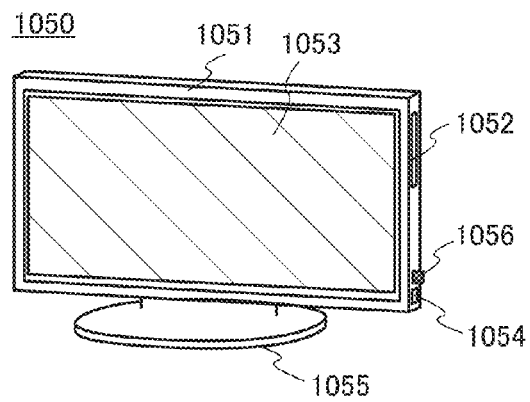

FIG. 26D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed in addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

This application is based on Japanese Patent Application serial no. 2013-208764 filed with Japan Patent Office on Oct. 4, 2013, the entire contents of which are hereby incorporated by reference.

What is claimed is:

1. A semiconductor device comprising:
   an oxide semiconductor layer; and
   a pair of electrodes in contact with the oxide semiconductor layer, the pair of electrodes including at least one of copper, aluminum, gold, and silver,
   wherein the oxide semiconductor layer has a stacked-layer structure comprising:
      a first oxide semiconductor layer comprising a channel;
      a second oxide semiconductor layer; and
      a third oxide semiconductor layer between the first oxide semiconductor layer and the second oxide semiconductor layer,
   wherein energy at a bottom of a conduction band of the second oxide semiconductor layer is smaller than energy at a bottom of a conduction band of the third oxide semiconductor layer and larger than energy at a bottom of a conduction band of the first oxide semiconductor layer, and
   wherein the second oxide semiconductor layer includes a crystal part having c-axis alignment.

2. A semiconductor device comprising:
   a first gate electrode;
   a gate insulating layer in contact with the first gate electrode;
   an oxide semiconductor layer facing the first gate electrode with the gate insulating layer interposed therebetween; and
   a pair of electrodes in contact with the oxide semiconductor layer, the pair of electrodes including at least one of copper, aluminum, gold, and silver,
   wherein the oxide semiconductor layer has a stacked-layer structure comprising:
      a first oxide semiconductor layer comprising a channel;
      a second oxide semiconductor layer; and
      a third oxide semiconductor layer between the first oxide semiconductor layer and the second oxide semiconductor layer,
   wherein energy at a bottom of a conduction band of the second oxide semiconductor layer is smaller than energy at a bottom of a conduction band of the third oxide semiconductor layer and larger than energy at a bottom of a conduction band of the first oxide semiconductor layer, and
   wherein the second oxide semiconductor layer includes a crystal part having c-axis alignment.

3. A semiconductor device comprising:
   a first gate electrode;
   a first gate insulating layer in contact with the first gate electrode;
   an oxide semiconductor layer facing the first gate electrode with the first gate insulating layer interposed therebetween;
   a pair of electrodes in contact with the oxide semiconductor layer, the pair of electrodes including at least one of copper, aluminum, gold, and silver;
   a second gate insulating layer in contact with the pair of electrodes; and
   a second gate electrode facing the oxide semiconductor layer with the second gate insulating layer interposed therebetween,
   wherein the oxide semiconductor layer has a stacked-layer structure comprising:
      a first oxide semiconductor layer comprising a channel;
      a second oxide semiconductor layer; and
      a third oxide semiconductor layer between the first oxide semiconductor layer and the second oxide semiconductor layer,
   wherein energy at a bottom of a conduction band of the second oxide semiconductor layer is smaller than energy at a bottom of a conduction band of the third oxide semiconductor layer and larger than energy at a bottom of a conduction band of the first oxide semiconductor layer, and
   wherein the second oxide semiconductor layer includes a crystal part having c-axis alignment.

4. The semiconductor device according to claim 1,
   wherein the first oxide semiconductor layer includes a crystal part having c-axis alignment, and
   wherein a c-axis of crystal part is aligned in a direction parallel to a normal vector of a top surface of the first oxide semiconductor layer.

5. The semiconductor device according to claim 2,
   wherein the first oxide semiconductor layer includes a crystal part having c-axis alignment, and
   wherein a c-axis of the crystal part is aligned in a direction parallel to a normal vector of a top surface of the first oxide semiconductor layer.

6. The semiconductor device according to claim 3,
   wherein the first oxide semiconductor layer includes a crystal part having c-axis alignment, and
   wherein a c-axis of the crystal part is aligned in a direction parallel to a normal vector of a top surface of the first oxide semiconductor layer.

7. The semiconductor device according to claim 1, wherein an angle between the c-axis of the crystal part and a normal vector of a top surface of the second oxide semiconductor layer is greater than or equal to $-10°$ and less than or equal to $10°$.

8. The semiconductor device according to claim 2, wherein an angle between the c-axis of the crystal part and a normal vector of a top surface of the second oxide semiconductor layer is greater than or equal to $-10°$ and less than or equal to $10°$.

9. The semiconductor device according to claim 3, wherein an angle between the c-axis of the crystal part and a normal vector of a top surface of the second oxide semiconductor layer is greater than or equal to $-10°$ and less than or equal to $10°$.

10. The semiconductor device according to claim 1, wherein the second oxide semiconductor layer and the third oxide semiconductor layer include one or more kinds of elements included in the first oxide semiconductor layer.

11. The semiconductor device according to claim 2, wherein the second oxide semiconductor layer and the third oxide semiconductor layer include one or more kinds of elements included in the first oxide semiconductor layer.

12. The semiconductor device according to claim 3, wherein the second oxide semiconductor layer and the third oxide semiconductor layer include one or more kinds of elements included in the first oxide semiconductor layer.

13. The semiconductor device according to claim 1,
wherein at least one of the first oxide semiconductor layer and the second oxide semiconductor layer includes a region, and
wherein with a transmission electron diffraction measurement apparatus, a diffraction pattern having a bright spot indicating alignment is observed in greater than or equal to 50% and less than 100% of the region when an observation area is changed one-dimensionally within a range of 300 nm.

14. The semiconductor device according to claim 2,
wherein at least one of the first oxide semiconductor layer and the second oxide semiconductor layer includes a region, and
wherein with a transmission electron diffraction measurement apparatus, a diffraction pattern having a bright spot indicating alignment is observed in greater than or equal to 50% and less than 100% of the region when an observation area is changed one-dimensionally within a range of 300 nm.

15. The semiconductor device according to claim 3,
wherein at least one of the first oxide semiconductor layer and the second oxide semiconductor layer includes a region, and
wherein with a transmission electron diffraction measurement apparatus, a diffraction pattern having a bright spot indicating alignment is observed in greater than or equal to 50% and less than 100% of the region when an observation area is changed one-dimensionally within a range of 300 nm.

* * * * *

UNITED STATES PATENT AND TRADEMARK OFFICE
CERTIFICATE OF CORRECTION

PATENT NO. : 9,812,585 B2  
APPLICATION NO. : 14/505002  
DATED : November 7, 2017  
INVENTOR(S) : Shunpei Yamazaki Page 1 of 1

It is certified that error appears in the above-identified patent and that said Letters Patent is hereby corrected as shown below:

In the Claims

In Claim 4, at Column 52, Line 34, "of crystal" should be --of the crystal--.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*